(12) United States Patent
Itasaka et al.

(10) Patent No.: US 10,978,995 B2
(45) Date of Patent: Apr. 13, 2021

(54) CIRCUIT DEVICE, OSCILLATOR, ELECTRONIC APPARATUS, AND VEHICLE

(71) Applicant: SEIKO EPSON CORPORATION, Tokyo (JP)

(72) Inventors: Yosuke Itasaka, Minowa-machi (JP); Naoki Ii, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/818,743

(22) Filed: Mar. 13, 2020

(65) Prior Publication Data

US 2020/0295707 A1 Sep. 17, 2020

(30) Foreign Application Priority Data

Mar. 15, 2019 (JP) .............................. JP2019-048153

(51) Int. Cl.
| | |
|---|---|
| *H03B 5/36* | (2006.01) |
| *H03B 5/02* | (2006.01) |
| *G11C 16/10* | (2006.01) |
| *H03K 3/356* | (2006.01) |

(52) U.S. Cl.
CPC .............. *H03B 5/02* (2013.01); *G11C 16/10* (2013.01); *H03B 5/362* (2013.01); *H03B 5/364* (2013.01); *H03B 5/368* (2013.01); *H03K 3/356017* (2013.01)

(58) Field of Classification Search
CPC . H03B 5/30; H03B 5/32; H03B 5/326; H03B 5/36; H03B 5/362; H03B 5/364; H03B 5/366; H03B 5/368

USPC .......... 331/36 C, 62, 116 FE, 116 M, 116 R, 331/154, 158, 177 V, 185, 186
See application file for complete search history.

(56) References Cited

U.S. PATENT DOCUMENTS

| | | | | |
|---|---|---|---|---|
| 4,039,973 | A | * 8/1977 | Yamashiro | ................ G04F 5/06 331/116 FE |
| 4,871,982 | A | * 10/1989 | Williams | ................. H03B 5/06 331/75 |
| 7,679,460 | B2 | * 3/2010 | Cao | ..................... G01R 31/2824 331/64 |
| 2014/0091872 | A1 | * 4/2014 | Itasaka | ................... H03B 5/364 331/36 C |

(Continued)

FOREIGN PATENT DOCUMENTS

| | | |
|---|---|---|
| JP | 2015-088924 A | 5/2015 |
| JP | 2015-088925 A | 5/2015 |

(Continued)

*Primary Examiner* — Levi Gannon
(74) *Attorney, Agent, or Firm* — Rankin, Hill & Clark LLP

(57) ABSTRACT

Provided is a circuit device including: a first terminal electrically coupled to one end of a vibrator; a second terminal electrically coupled to the other end of the vibrator; an oscillation circuit electrically coupled to the first terminal and the second terminal, and oscillating the vibrator; a third terminal to which an external input signal is input; a switch circuit provided between a first wiring which couples the first terminal and the oscillation circuit with each other and the third terminal, and having a P-type transistor; and a control circuit outputting a regulated voltage, in which a power supply voltage is regulated, as a substrate voltage of the P-type transistor.

18 Claims, 16 Drawing Sheets

(56) References Cited

U.S. PATENT DOCUMENTS

| | | | |
|---|---|---|---|
| 2015/0116043 A1* | 4/2015 | Itasaka | H03B 5/362 |
| | | | 331/62 |
| 2015/0116044 A1 | 4/2015 | Itasaka et al. | |
| 2015/0116045 A1* | 4/2015 | Itasaka | H03B 5/368 |
| | | | 331/62 |
| 2015/0116048 A1 | 4/2015 | Yamamoto et al. | |
| 2015/0123743 A1* | 5/2015 | Kiyohara | H03B 5/368 |
| | | | 331/36 C |
| 2015/0130547 A1 | 5/2015 | Ishikawa et al. | |
| 2019/0007012 A1* | 1/2019 | Marques | H03F 3/45179 |
| 2019/0033250 A1* | 1/2019 | Ono | H01L 23/345 |
| 2020/0099337 A1* | 3/2020 | Powell | H03B 5/26 |

FOREIGN PATENT DOCUMENTS

| | | |
|---|---|---|
| JP | 2015-088930 A1 | 5/2015 |
| JP | 2015-088931 A | 5/2015 |
| JP | 2015-095709 A | 5/2015 |

\* cited by examiner

FIG. 3
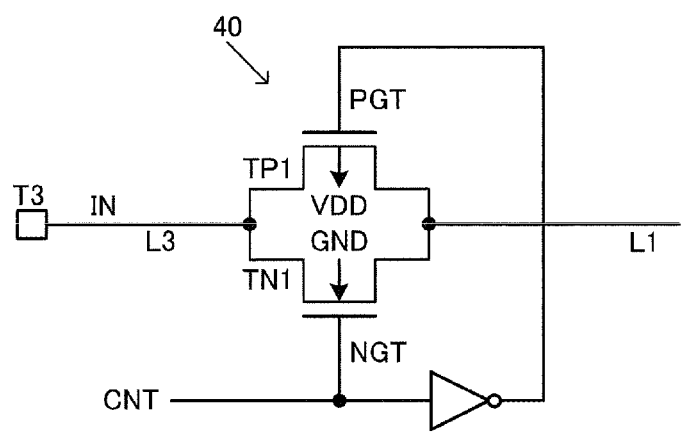
FIG. 4
| MODE | CNT | NGT | PGT | NSUB | PSUB | SW | L3-L1 |
|---|---|---|---|---|---|---|---|
| NORMAL | L | GND | VDD | GND | VDD | OFF | OPEN |
| TEST | H | VDD | GND | GND | VDD | ON | SHORT |
FIG. 5
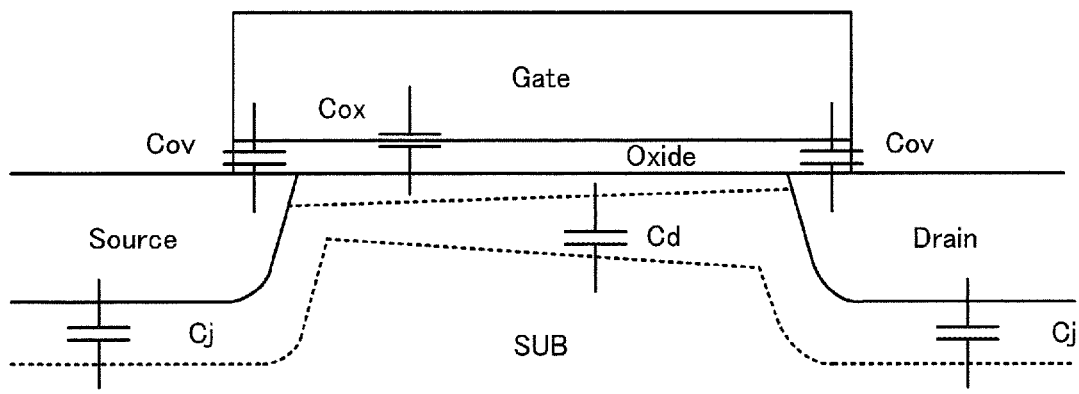

FIG. 6
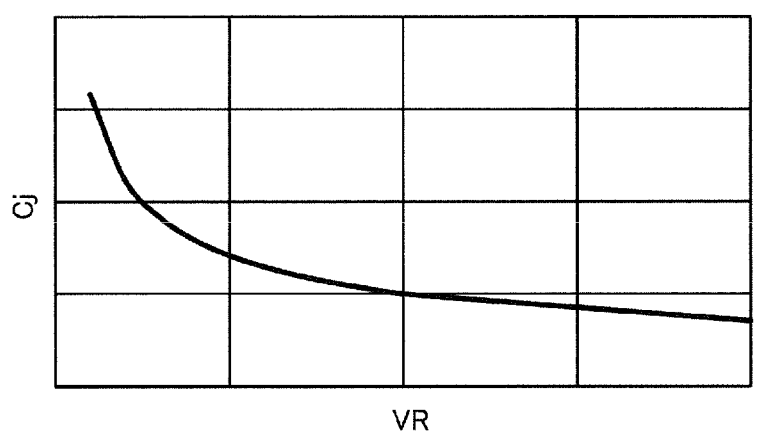
FIG. 7
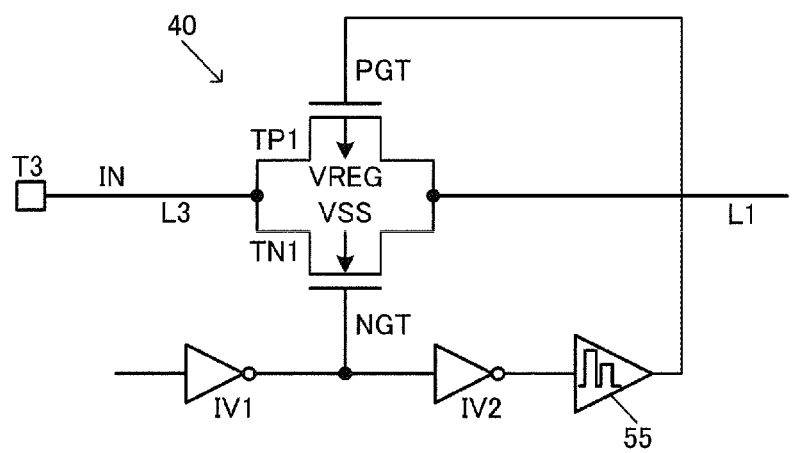
FIG. 8
| MODE | CNT | NGT | PGT | NSUB | PSUB | SW | L3-L1 |
|------|-----|-----|-----|------|------|-----|-------|
| NORMAL | L | GND | VREG | GND | VREG | OFF | OPEN |
| TEST | H | VDD | GND | GND | VDD | ON | SHORT |

FIG. 15

| MODE | CNT | IN | EN | XEN | XENL | VSB | VSB2 | TP1 | TN1 | TP2 | TP3 | TP4 | TN2 | TP5 |
|---|---|---|---|---|---|---|---|---|---|---|---|---|---|---|
| NORMAL | 0 | ≤VDD | 0 | VDD | VREG | VREG | VDD | OFF | OFF | OFF | ON | ON | ON | OFF |
| TEST | VDD | ≤VDD | VDD | 0 | 0 | VDD | VDD | ON | ON | ON | ON | OFF | OFF | ON |
| MEMORY WRITE | 0 | >VDD (6V) | 0 | VDD | VREG | VREG | IN | OFF | OFF | OFF | OFF | ON | ON | OFF |

CIRCUIT DEVICE, OSCILLATOR, ELECTRONIC APPARATUS, AND VEHICLE

The present application is based on, and claims priority from JP Application Serial Number 2019-048153, filed Mar. 15, 2019, the disclosure of which is hereby incorporated by reference herein in its entirety.

BACKGROUND

1. Technical Field

The present disclosure relates to a circuit device, an oscillator, an electronic apparatus, and a vehicle.

2. Related Art

In a vibrator such as a quartz crystal vibrator, when foreign matter generated during the manufacture is attached to the vibrator, a problem such as the oscillation frequency becoming unstable due to the foreign matter or jumping to a frequency with a different oscillation frequency due to the removal of the attached foreign matter occurs. In order to solve such a problem, the foreign matter is removed by performing overdrive with respect to the vibrator at the time of inspection or manufacturing. As a related art technique that enables such overdrive, there is a technique disclosed in JP-A-2015-88930. In JP-A-2015-88930, a terminal used as a frequency control terminal during a normal operation is electrically coupled to one end of the vibrator via a switch circuit of a circuit device during the inspection. Thereby, an overdrive signal can be applied to the vibrator using the frequency control terminal.

However, when such a switch circuit is provided, the presence of the switch circuit may adversely affect an oscillation operation of the vibrator during the normal operation, and problems such as fluctuations in the oscillation frequency may occur.

SUMMARY

An aspect of the present disclosure relates to a circuit device including: a first terminal electrically coupled to one end of a vibrator; a second terminal electrically coupled to the other end of the vibrator; an oscillation circuit electrically coupled to the first terminal and the second terminal, and oscillating the vibrator; a third terminal to which an external input signal is input; a switch circuit provided between a first wiring, which couples the first terminal and the oscillation circuit, and the third terminal, and having a P-type transistor; and a control circuit outputting a regulated voltage, in which a power supply voltage is regulated, as a substrate voltage of the P-type transistor.

BRIEF DESCRIPTION OF THE DRAWINGS

FIG. 3 is an explanatory diagram of a problem caused by a switch circuit.

FIG. 4 is an explanatory diagram of a problem caused by the switch circuit.

FIG. 5 is an explanatory diagram of a junction capacitance.

FIG. 6 is an explanatory diagram of the junction capacitance.

FIG. 7 shows a configuration example of the switch circuit.

FIG. 8 is an explanatory diagram of an operation of a switch circuit.

FIG. 15 is an explanatory diagram of operations of the switch circuit and the control circuit.

DESCRIPTION OF EXEMPLARY EMBODIMENTS

Hereinafter, the present embodiment will be described. Note that the present embodiment to be described below does not unduly limit the contents of the present disclosure described in the appended claims. In addition, all configurations to be described in the present embodiment are not limited to being essential constituent conditions.

1. Circuit Device

Figure 1:
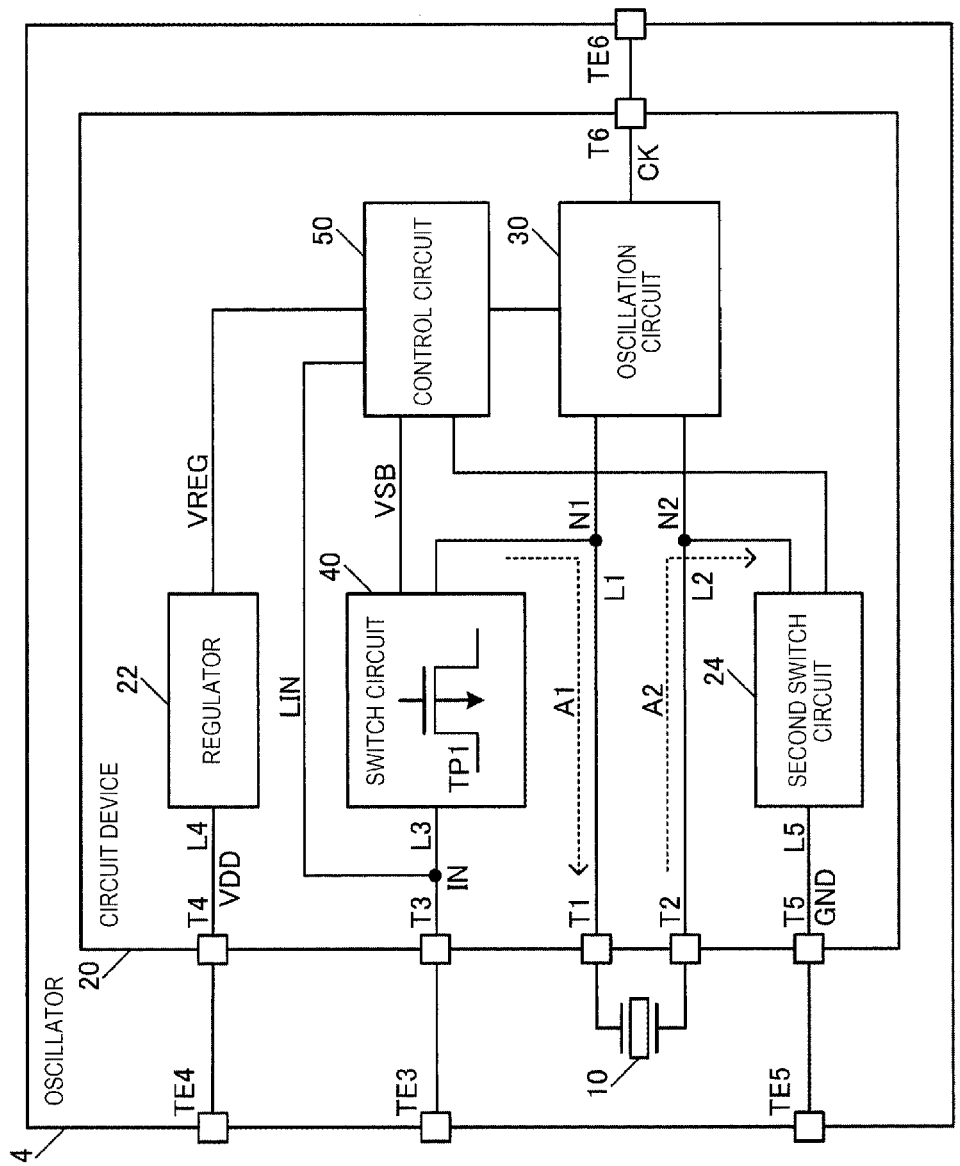
FIG. 1 shows a configuration example of a circuit device according to a present embodiment.

FIG. 1 shows a configuration example of a circuit device 20 according to a present embodiment. The circuit device 20 of the present embodiment includes an oscillation circuit 30, a switch circuit 40, and a control circuit 50. Further, the oscillator 4 of the present embodiment includes a vibrator 10 and the circuit device 20. The vibrator 10 is electrically coupled to the circuit device 20. For example, the vibrator 10 and the circuit device 20 are electrically coupled using an internal wiring, a bonding wire, a metal bump, or the like of a package that accommodates the vibrator 10 and the circuit device 20.

The vibrator 10 is an element generating mechanical vibration by an electric signal. The vibrator 10 can be realized by a vibrator element such as a quartz crystal vibrator element, for example. For example, the vibrator 10 can be realized by a quartz crystal vibrator element in which a cut angle vibrates in a thickness-slide manner such as an AT cut or an SC cut. For example, the vibrator 10 may be a vibrator of a simple packaged crystal oscillator (SPXO). Alternatively, the vibrator 10 may be a vibrator built in a constant temperature oven controlled crystal oscillator (OCXO) having a constant temperature oven, or a vibrator built in a temperature compensated crystal oscillator (TCXO) having no constant temperature oven. Note that the vibrator 10 according to the present embodiment can be realized by various vibrator elements such as vibrator elements other than a thickness-slide vibration type or piezoelectric vibrator elements formed of materials other than quartz crystal. For example, as the vibrator 10, a surface acoustic wave (SAW) vibrator, a micro electro mechanical systems (MEMS) vibrator as a silicon vibrator formed using a silicon substrate, or the like may be adopted.

The circuit device 20 is an integrated circuit device called an integrated circuit (IC). For example, the circuit device 20 is an IC manufactured by a semiconductor process, and is a semiconductor chip in which circuit elements are formed on a semiconductor substrate.

The circuit device 20 includes terminals T1, T2, and T3, an oscillation circuit 30, a switch circuit 40, and a control circuit 50. The circuit device 20 can include a regulator 22 or a second switch circuit 24. The terminal T1 is a first terminal, the terminal T2 is a second terminal, and the terminal T3 is a third terminal. Terminals T1, T2, and T3 are, for example, pads of the circuit device 20.

The terminal T1 is electrically coupled to one end of the vibrator 10, and the terminal T2 is electrically coupled to the other end of the vibrator 10. For example, the terminals T1 and T2 of the circuit device 20 and the vibrator 10 are electrically coupled with each other using an internal wiring, a bonding wire, a metal bump, or the like of a package that accommodates the vibrator 10 and the circuit device 20.

The terminal T3 is a terminal to which an external input signal IN is input. For example, the terminal T3 is a terminal to which the external input signal IN can be input, and the external input signal IN is input in a first mode or a second mode. The first mode is, for example, a normal operation mode, and the second mode is, for example, a test mode. The test mode can also be called an inspection mode.

The oscillation circuit 30 is electrically coupled to the terminal T1 and the terminal T2, and causes the vibrator 10 to oscillate. Specifically, the oscillation circuit 30 is coupled to the terminal T1 via a wiring L1, and is coupled to the terminal T2 via a wiring L2. For example, the oscillation circuit 30 includes an oscillation drive circuit provided between the terminal T1 and the terminal T2 that are vibrator coupling terminals. For example, the oscillation circuit 30 can be realized by a transistor such as a bipolar transistor that realizes a drive circuit, and realized by an active element such as a capacitor or a resistor. As the oscillation circuit 30, various types of oscillation circuits can be used such as a Pierce type, a Colpitts type, an inverter type, or a Hartley type. The oscillation circuit 30 operates using, for example, a regulated voltage VREG as a power supply voltage. The oscillation circuit 30 may be provided with a variable capacitance circuit, and the oscillation frequency may be adjusted by adjusting the capacity of the variable capacitance circuit. The variable capacitance circuit can be realized by a variable capacitance element such as a varactor. For example, the variable capacitance circuit is electrically coupled to the wiring L1 to which the terminal T1 is coupled. The oscillation circuit 30 may have a first variable capacitance circuit electrically coupled to the wiring L1 to which the terminal T1 is coupled, and have a second variable capacitance circuit electrically coupled to the wiring L2 to which the terminal T2 is coupled. Further, a coupling in the present embodiment is an electrical coupling. The electrical coupling is a coupling to which an electrical signal is transmittable, and a coupling that enables transmission of information by an electrical signal. The electrical coupling may be a coupling via an active element or the like.

The switch circuit 40 is provided between the wiring L1, which couples the terminal T1 and the oscillation circuit 30, and the terminal T3. The switch circuit 40 has a P-type transistor TP3. The wiring L1 is a first wiring. For example, the switch circuit 40 is provided between the terminal T1 and the terminal T3, and is a circuit that turns on or off the electrical coupling between the terminal T1 and the terminal T3. For example, one end of the switch circuit 40 is coupled to the wiring L1. For example, the switch circuit 40 is coupled to a node N1 that is a coupling node with the wiring L1. The other end of the switch circuit 40 is coupled to a wiring L3 that couples the switch circuit 40 and the terminal T3. The wiring L3 is a third wiring. The switch circuit 40 is controlled to be turned on and off by the control circuit 50. For example, when the switch circuit 40 is turned on, the terminal T3 and the terminal T1 are electrically coupled with each other. Thereby, the external input signal IN can be input to the one end of the vibrator 10.

For example, in the normal operation mode, a frequency control signal, an output enable signal, or a standby signal is input as the external input signal IN via the terminal T3. At this time, the switch circuit 40 is already turned off. The external input signal IN that is a frequency control signal, an output enable signal, or a standby signal is input to the control circuit 50 via a signal input wiring LIN. The control circuit 50 performs frequency control, output enable control, or standby control processing based on the frequency control signal, output enable signal, or standby signal input via the wiring LIN.

On the other hand, in the test mode, a test mode signal such as an overdrive signal is input as the external input signal IN via the terminal T3. Further, the test mode signal is input to the one end of the vibrator 10 via the switch circuit 40 that is turned on. Note that the external input signal IN may be a power supply voltage signal, and in this case, the terminal T3 is a power supply terminal.

The control circuit 50 performs various control processing. For example, the control circuit 50 performs various controls for the switch circuit 40. The control circuit 50 can also control the oscillation circuit 30 and the like. For example, the switch circuit 40 is controlled to be turned on and off by the control circuit 50. That is, a metal oxide semiconductor (MOS) P-type transistor TP1 of the switch circuit 40 is controlled to be turned on and off by the control circuit 50. Further, the control circuit 50 outputs the regulated voltage VREG, in which the power supply voltage VDD is regulated, as a substrate voltage of the P-type transistor TP1. The regulated voltage VREG is a voltage that is lower than the power supply voltage VDD, and it is indicated by VREG<VDD. The substrate voltage is a voltage that is applied to a semiconductor substrate of the transistor TP1, and is also called a back gate voltage. That is, the control circuit 50 controls a back gate voltage of the P-type transistor TP1.

For example, the control circuit 50 outputs the regulated voltage VREG as the substrate voltage of the transistor TP1 in the first mode, and outputs the power supply voltage VDD as the substrate voltage of the transistor TP1 in the second mode. The first mode is, for example, a normal operation mode, and the second mode is, for example, a test mode. The normal operation mode is a mode in which the oscillator 4 performs a normal oscillation operation to generate a clock signal CK. The test mode is a mode for performing various tests and inspections such as removing foreign matter from the vibrator 10 by overdrive and inspecting drive level dependence (DLD) characteristics. The DLD characteristic is a characteristic indicating a relationship between an excitation level and an oscillation frequency of the vibrator 10. During an actual operation in which the oscillator 4 operates as a product, the circuit device 20 is set to the first mode. When a test or inspection for overdrive or DLD is performed on the oscillator 4, the circuit device 20 is set to the second mode.

The circuit device 20 includes a terminal T4 to which the power supply voltage VDD is input and a terminal T5 to which a ground voltage GND is input. The GND can also be referred to as VSS, and the ground voltage is, for example, a ground potential. Further, the circuit device 20 includes a terminal T6 from which the clock signal CK is output. The terminal T4 is a fourth terminal, the terminal T5 is a fifth terminal, and the terminal T6 is a sixth terminal. Terminals T4, T5, and T6 are, for example, pads of the circuit device 20.

As shown in FIG. 1, the terminals T3, T4, T5, and T6 are electrically coupled to external terminals TE3, TE4, TE5, and TE6 for external coupling of the oscillator 4, respectively. For example, the terminals T3 to T6 and the external terminals TE3 to TE6 are electrically coupled with each other using the internal wiring, the bonding wire, the metal bump, or the like of the package. The external terminals TE3 to TE6 of the oscillator 4 are electrically coupled to an external device.

Further, the circuit device 20 can include a regulator 22 that outputs the regulated voltage VREG. The regulator 22 is coupled to the terminal T4 via the wiring L4. The wiring L4 is a fourth wiring. The regulator 22 outputs the regulated voltage VREG based on the power supply voltage VDD from the terminal T4. That is, the regulator 22 performs a regulation operation based on the power supply voltage VDD, and generates the regulated voltage VREG. Various known configurations can be adopted as a circuit configuration of the regulator 22. For example, the regulator 22 includes a calculation amplifier, a driving transistor, a resistor, or the like. As an example, a reference voltage such as a bandgap reference voltage is input to a non-inverting input terminal of the calculation amplifier, and an output terminal of the calculation amplifier is coupled to a gate of a driving transistor. A first resistor and a second resistor are provided in series between a drain of the driving transistor and the GND node, and a coupling node of the first resistor and the second resistor is coupled to an inverting input terminal of the calculation amplifier.

The circuit device 20 can include a second switch circuit 24. The second switch circuit 24 is provided between the wiring L2, which couples the terminal T2 and the oscillation circuit 30, and the terminal T5. The wiring L2 is a second wiring. For example, the second switch circuit 24 is provided between the terminal T2 and the terminal T5, and is a circuit that turns on or off the electrical coupling between the terminal T2 and the terminal T5. For example, one end of the second switch circuit 24 is coupled to the wiring L2. For example, the second switch circuit 24 is coupled to a node N2 that is a coupling node with the wiring L2. The other end of the second switch circuit 24 is coupled to a wiring L5 that couples the second switch circuit 24 and the terminal T5. The wiring L5 is a fifth wiring. The second switch circuit 24 is turned on when the switch circuit 40 is turned on. For example, the second switch circuit 24 is controlled to be turned on and off by the control circuit 50 in the same manner as the switch circuit 40 that is the first switch circuit. Further, when the switch circuit 40 is turned on, the second switch circuit 24 is also turned on to electrically couple the terminal T2 and the terminal T5. Thereby, the other end of the vibrator 10 can be set to the GND, and the vibrator 10 can be overdriven or the like. In the present embodiment, the case where two switch circuits such as the switch circuit 40 and the second switch circuit 24 are provided has been described. However, the present disclosure is not limited to this. For example, in the case of a circuit configuration of which one end of the vibrator 10 is coupled to the GND node with each other, by providing the switch circuit 40 on the other end side of the vibrator 10, it is possible to perform an inspection such as overdrive by using one switch circuit 40.

Figure 2:
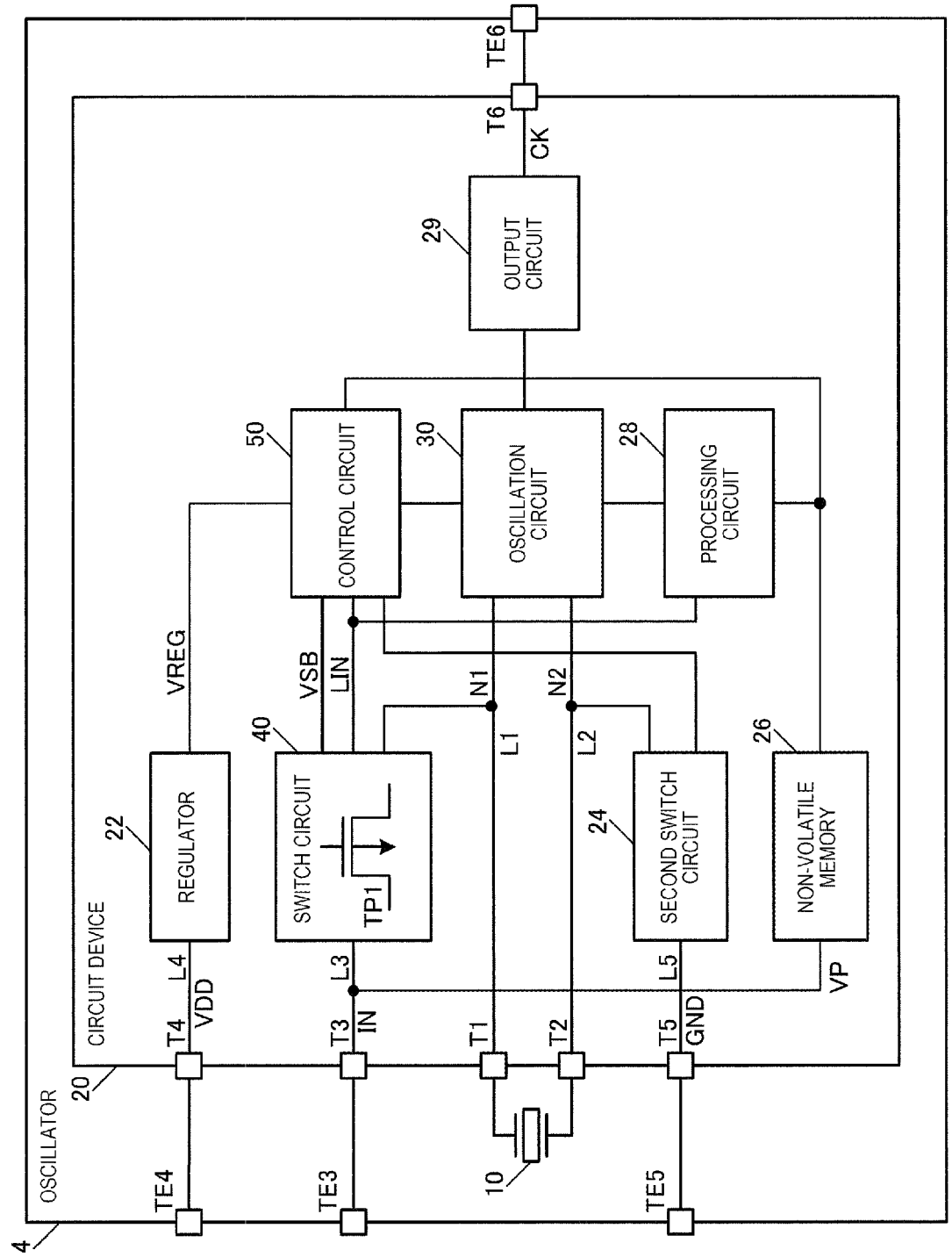
FIG. 2 shows a detailed configuration example of the circuit device according to the present embodiment.

FIG. 2 shows a detailed configuration example of the circuit device 20. In FIG. 2, in addition to the configuration of FIG. 1, a non-volatile memory 26, a processing circuit 28, and an output circuit 29 are further provided.

The non-volatile memory 26 stores various information necessary for the operation of the circuit device 20 and the like. For example, the non-volatile memory 26 stores temperature compensation information, and the processing circuit 28 performs temperature compensation processing of clock frequency based on the temperature compensation information. The temperature compensation information is, for example, coefficient information for a polynomial approximation when polynomial approximation of the frequency-temperature characteristics of the vibrator 10 is performed. For example, the non-volatile memory 26 stores high-order coefficient information of zeroth-order, first-order, third-order or fourth-order or higher in the polynomial approximation. Further, the non-volatile memory 26 stores register setting information included in the control circuit 50. The control circuit 50 controls the operation of the circuit device 20 based on information set in the register. For example, control for turning on or off the switch circuit 40 or the second switch circuit 24 is performed. Specifically, when the circuit device 20 is powered on, information is read from the non-volatile memory 26, and the read information is written to the register. The control circuit 50 or the processing circuit 28 performs various processing based on the information read from the register. The non-volatile memory 26 is realized by a semiconductor memory, for example. As the non-volatile memory 26, an electrically erasable programmable read-only memory (EEPROM) capable of electrical erasure of data, or one time programmable (OTP) memory or the like using a floating gate avalanche injection MOS (FAMOS) or the like can be used.

A memory writing voltage VP is supplied to the non-volatile memory 26 via the terminal T3. For example, when an information writing operation is performed on the non-volatile memory 26, a voltage VP of, for example, 6 V for writing to the memory is supplied to the non-volatile memory 26 via the terminal T3 as an external input signal from the external device. The non-volatile memory 26 uses the high voltage VP and performs an operation to write information into the memory cell.

The processing circuit 28 performs various processing such as temperature compensation processing. For example, the processing circuit 28 performs function generation processing for compensating the frequency-temperature characteristics of the vibrator 10 by using the polynomial approximation. For example, the processing circuit 28 generates a zeroth-order component signal, a first-order component signal, a third-order component signal, and a high-order component signal that approximate a zeroth-order component, a first-order component, a third-order component, and a high-order component of the frequency-temperature characteristics of the vibrator 10 based on the coefficient information for the zeroth-order component, first-order component, third-order component, and high-order component read from the non-volatile memory 26. Further, the processing circuit 28 performs adding processing of the zeroth-order component signal, first-order component signal, third-order component signal, and high-order component signal, so that the control voltage for compensating the frequency-temperature characteristics of the vibrator 10 is generated. The capacity of the variable capacitance circuit included in the oscillation circuit 30 is controlled based on the control voltage, so that the temperature compensation processing of the frequency of the clock signal CK is realized.

The output circuit 29 outputs the clock signal CK to the outside in various signal formats. For example, the output circuit 29 outputs the clock signal CK to the outside in a signal format such as a low voltage differential signaling (LVDS), a positive emitter coupled logic (PECL), an high speed current steering logic (HCSL), or a differential complementary MOS (CMOS).

For example, the output circuit 29 may be a circuit that can output the clock signal CK in at least two signal formats of LVDS, PECL, HCSL, and differential CMOS. In this case, the output circuit 29 outputs the clock signal CK in the signal format set by the control circuit 50. The signal format of the clock signal CK output from the output circuit 29 is not limited to a differential signal format, and may be a non-differential signal format such as a single-ended CMOS or a clipped sine wave, for example.

In the circuit device 20 in FIG. 2, in the normal operation mode, a frequency control signal, an output enable signal, or a standby signal is input as the external input signal IN via the terminal T3. The external input signal IN is input to the control circuit 50 or the processing circuit 28 via a protection transistor TP3 and a signal input wiring LIN in FIG. 14 to be described later. The control circuit 50 or processing circuit 28 performs frequency control, output enable control, or standby control processing based on the frequency control signal, output enable signal, or standby signal input via the wiring LIN.

In the test mode, a test mode signal such as an overdrive signal is input as the external input signal IN via the terminal T3. Further, the test mode signal is input to the one end of the vibrator 10 via the switch circuit 40 that is turned on. Thereby, it is possible to perform tests and inspections such as overdrive of the vibrator 10.

On the other hand, in the memory writing mode, the memory writing voltage VP is input via the terminal T3. The memory writing mode is a third mode. At this time, the switch circuit 40 is turned off to prevent the high voltage VP from being transmitted to the internal circuits such as the control circuit 50, the oscillation circuit 30, and the processing circuit 28. Specifically, by turning off the withstanding voltage protection transistor TP3 in FIG. 14 to be described later, the memory writing voltage VP is prevented from being transmitted to the wiring LIN or the wiring L1, and the voltage VP exceeding the withstanding voltage of the internal circuit is prevented from being applied. In FIG. 2, the switch circuit 40 is formed in a one-input, two-output switch circuit. Accordingly, the switch circuit 40 turns on the coupling with the wiring L3 and the wiring LIN in the normal operation mode, turns on the coupling with the wiring L3 and the wiring L1 in the test mode, and turns off the coupling with the wiring L3, the wiring L1, and the wiring LIN in the memory writing mode.

2. Substrate Voltage Setting Using Regulated Voltage

In the circuit device 20 in FIGS. 1 and 2, various test modes can be realized by providing the switch circuit 40. For example, in an overdrive mode, the switch circuit 40 and the second switch circuit 24 are turned on. As a result, as shown in A1 and A2 in FIG. 1, an overdrive signal that is an external input signal IN is input via the terminal T3, and the signal is input to one end of the vibrator 10, thereby foreign matter removal or the like by the overdrive becomes possible. In addition, DLD inspection or the like can be performed by the same method.

By providing the switch circuit 40 in this way, various test modes such as overdrive can be realized. However, when such a switch circuit 40 is provided, the presence of the switch circuit 40 may adversely affect an oscillation operation of the vibrator during the normal operation, and problems such as fluctuations in the oscillation frequency may occur. FIGS. 3 and 4 are explanatory diagrams for problems caused by the switch circuit 40. In FIG. 3, a substrate voltage of the transistor TP1 constituting the switch circuit 40 is set to VDD, and a substrate voltage of the MOS N-type transistor TN1 is set to GND. Further, the switch circuit 40 is controlled to be turned on and off based on a control signal CNT.

FIG. 4 is an explanatory diagram of the operation of the switch circuit 40 in FIG. 3. In the normal operation mode, the control signal CNT becomes an L level. As a result, a gate NGT of the transistor TN1 is set to GND, a gate PGT of the transistor TP1 is set to VDD, the switch circuit 40 (SW) is turned off, and the space between the wiring L3 and the wiring L1 becomes an open state. Therefore, the external input signal IN input from the terminal T3 via the wiring L3 is not transmitted to the wiring L1 coupled to the terminal T1. On the other hand, in the test mode, the control signal CNT becomes an H level. As a result, the gate NGT of the transistor TN1 is set to VDD, the gate PGT of the transistor TP1 is set to GND, the switch circuit 40 is turned on, and the space between the wiring L3 and the wiring L1 becomes a short-circuited state. Accordingly, the external input signal IN input from the terminal T3 via the wiring L3 is transmitted to the wiring L1.

In FIG. 4, in both the normal operation mode and the test mode, a substrate NSUB of the transistor TN1 is set to GND, and a substrate PSUB of the transistor TP1 is set to VDD. Therefore, when the power supply voltage VDD fluctuates in the normal operation mode, the power supply voltage fluctuation adversely affects the oscillation operation of the vibrator 10 and a problem of fluctuation of the oscillation frequency occurs. For example, FIG. 5 is an explanatory diagram of parasitic capacitance of a transistor. As shown in FIG. 5, a junction capacitance Cj, which is a parasitic capacitance, exists between the source and drain of the transistor and the substrate. This junction capacitance Cj can be represented as following Expression (1).

$$Cj = \frac{dQ}{dVR} = qN_D \frac{dx_n}{dVR} = \sqrt{\frac{q\varepsilon}{2(Vbi + VR)\left(\frac{1}{N_A} + \frac{1}{N_D}\right)}} \quad (1)$$

$$\cong \sqrt{\frac{K_a}{VR}}$$

Q: Electric Charge
VR: Reverse Direction Bias Voltage
q: Electric Quantity
$X_n$: Depletion Layer Width
$\varepsilon$: Permittivity
$N_A$: Acceptor Density
$N_D$: Donor Density
$K_a$: Constant FIG. 6 is a diagram showing a change in the junction capacitance Cj with respect to a reverse direction bias voltage VR. As shown in above Expression (1) and FIG. 6, the junction capacitance Cj increases as the reverse direction bias voltage VR decreases. In FIG. 3, when the power supply voltage VDD fluctuates and the substrate voltage of the P-type transistor TP1 fluctuates, for example, the voltage between the drain and the substrate of the transistor TP1 fluctuates, and the junction capacitance Cj between the drain and the substrate fluctuates. The drain of the transistor TP1 is coupled to the wiring L1. The wiring L1 is coupled to one end of the vibrator 10 via the terminal T1.

Note that here, the drain is an impurity area on the wiring L1 side of the transistor TP1. Therefore, when the junction capacitance Cj between the drain and the substrate of the P-type transistor TP1 fluctuates due to the fluctuation of the power supply voltage VDD, the load capacitance of the wiring L1 which is coupled to one end of the vibrator 10 also fluctuates. In this way, when the load capacitance of the wiring L1 fluctuates, the oscillation frequency of the vibrator 10 fluctuates, and the frequency of the clock signal CK also fluctuates. As a result, there arises a problem that the frequency accuracy of the clock signal CK is lowered and the frequency jitter is increased.

In order to solve such a problem, in the circuit device 20 according to the present embodiment, the control circuit 50 outputs the regulated voltage VREG in which the power supply voltage VDD is regulated as a substrate voltage VSB of the P-type transistor TP1 included in the switch circuit 40. That is, the regulated voltage VREG having a stable potential that is not affected by fluctuations in the power supply voltage VDD is supplied as the substrate voltage VSB of the transistor TP1. For example, the regulated voltage VREG is a voltage generated by the regulator 22 through a regulating operation based on the power supply voltage VDD. Thus, a fluctuation amount of the regulated voltage VREG becomes extremely small with respect to a fluctuation amount of the power supply voltage VDD. Therefore, the regulated voltage VREG supplied as the substrate voltage VSB of the P-type transistor TP1 has a small fluctuation amount even when the power supply voltage VDD fluctuates, so that the fluctuation of the junction capacitance Cj can be reduced. Therefore, fluctuations in the load capacitance of the wiring L1 coupled to the one end of the vibrator 10 can be reduced, and fluctuations in the oscillation frequency can be also reduced, thereby, it is possible to realize a highly accurate and low jitter clock frequency. The control circuit 50 outputs the regulated voltage VREG as the substrate voltage VSB of the transistor TP1 in the normal operation mode that is the first mode, and also outputs the power supply voltage VDD as the substrate voltage VSB of the transistor TP1 in the test mode that is the second mode. Accordingly, even when a power supply voltage level signal, for example, is input as the external input signal IN, it is possible to prevent a leakage current from occurring in the substrate of the transistor TP1.

FIG. 7 shows a configuration example of the switch circuit 40. The switch circuit 40 in FIG. 7 is a transfer gate constituted by a P-type transistor and an N-type transistor. By adopting such a transfer gate configuration, the voltage drop in the switch circuit 40 can be reduced. Therefore, for example, in the test mode that is the second mode, the voltage drop in the switch circuit 40 for the external input signal IN can be reduced, and appropriate inspection or the like can be realized. In FIG. 7, the switch circuit 40 is provided with inverters IV1 and IV2 or a level shifter 55. The level shifter 55 performs a conversion of a voltage level of a signal input to a gate PGT of the P-type transistor TP1.

FIG. 8 is an explanatory diagram of the operation of the switch circuit 40 in FIG. 7. FIG. 8 differs from FIG. 4 in that a substrate PSUB of the transistor TP1 is set to VDD in the normal operation mode in FIG. 4 whereas the substrate PSUB is set to VREG in FIG. 8. Further, in FIG. 8, in the test mode, the substrate PSUB of the transistor TP1 is set to VDD same as in FIG. 4. As shown in FIG. 8, in the normal operation mode, by setting the substrate PSUB of the transistor TP1 to the regulated voltage VREG, even when the power supply voltage VDD fluctuates, the voltage fluctuation of the substrate PSUB can be reduced, and fluctuation in the junction capacitance between the drain and the substrate of the transistor TP1 can be reduced. Therefore, the fluctuation of the oscillation frequency of the vibrator 10 due to the fluctuation of the junction capacitance can be reduced, and a highly accurate clock frequency or the like can be achieved.

Figure 9:
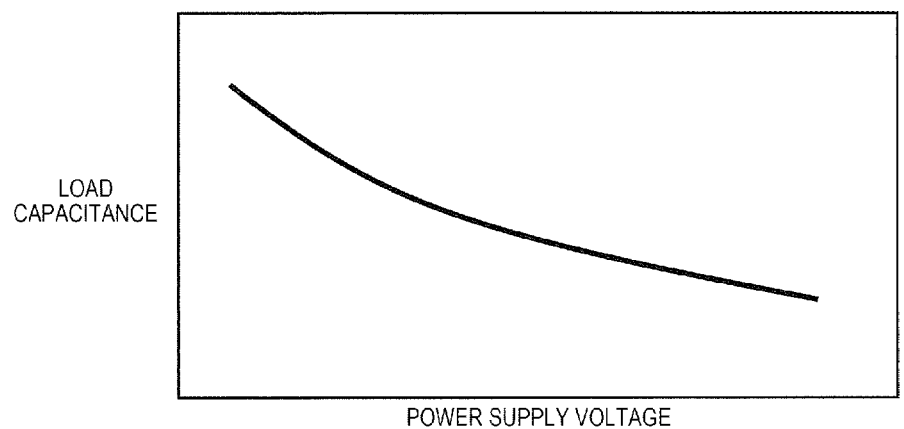
FIG. 9 is an explanatory diagram of a fluctuation in load capacitance due to a fluctuation of a power supply voltage.
Figure 10:
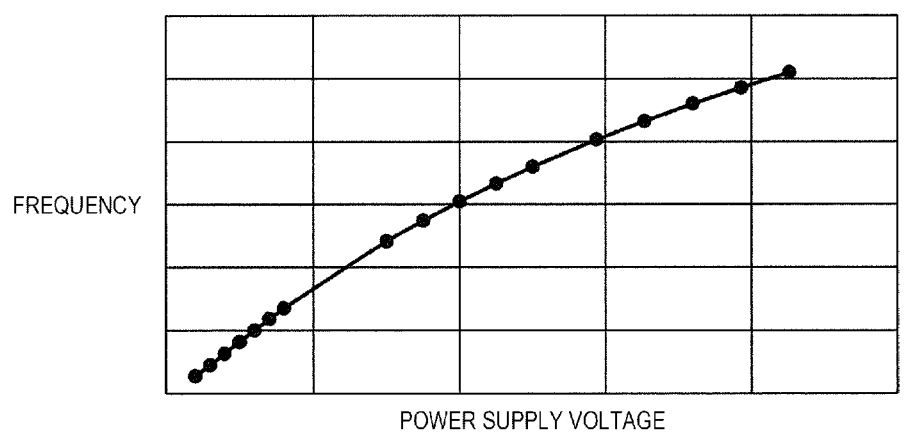
FIG. 10 is an explanatory diagram of a frequency fluctuation due to the fluctuation of the power supply voltage.

For example, FIG. 9 is a diagram showing a fluctuation in the load capacitance of the vibrator 10 with respect to the power supply voltage fluctuations in the comparative examples in FIGS. 3 and 4. FIG. 10 is a diagram showing an oscillation frequency fluctuation with respect to the power supply voltage fluctuations in the comparative examples. In FIGS. 9 and 10, the oscillation frequency also fluctuates due to the fluctuations in the load capacitance by the power supply voltage fluctuation.

Figure 11:
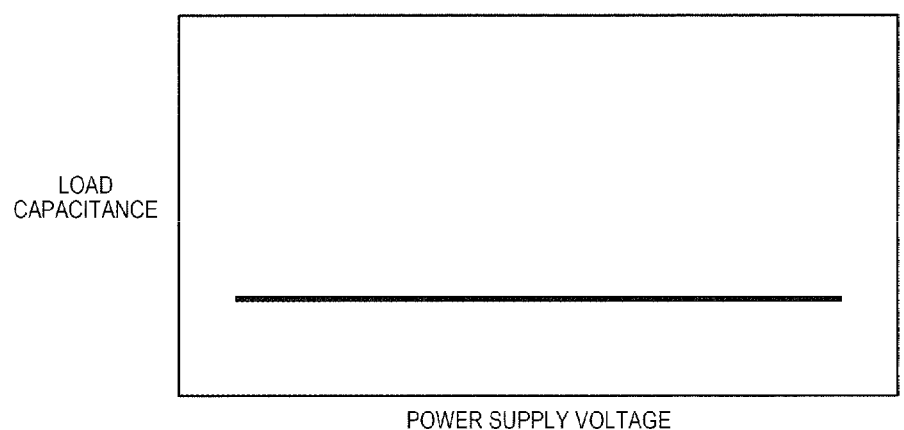
FIG. 11 is an explanatory diagram of improvement of the fluctuation in load capacitance using a method of the present embodiment.
Figure 12:
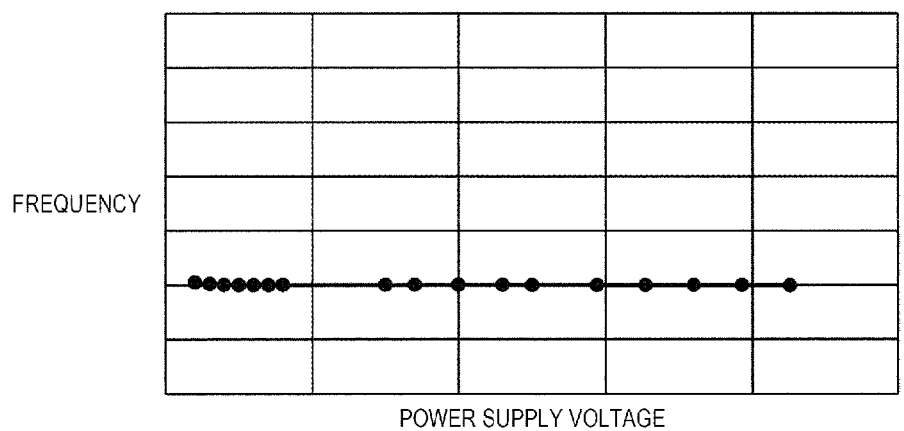
FIG. 12 is an explanatory diagram of improvement of the fluctuation in frequency using a method of the present embodiment.

On the other hand, FIG. 11 is a diagram showing a fluctuation in the load capacitance of the vibrator 10 with respect to the power supply voltage fluctuations in the present embodiment. FIG. 12 is a diagram showing an oscillation frequency fluctuation with respect to the power supply voltage fluctuations in the present embodiment. According to the present embodiment, as shown in FIGS. 11 and 12, the load capacitance hardly fluctuates with respect to the power supply voltage fluctuation, so that the oscillation frequency fluctuation with respect to the power supply voltage fluctuation can be extremely reduced. Accordingly, it is possible to realize a highly accurate and low jitter clock frequency.

3. Control Circuit and Switch Circuit Configurations

Figure 13:
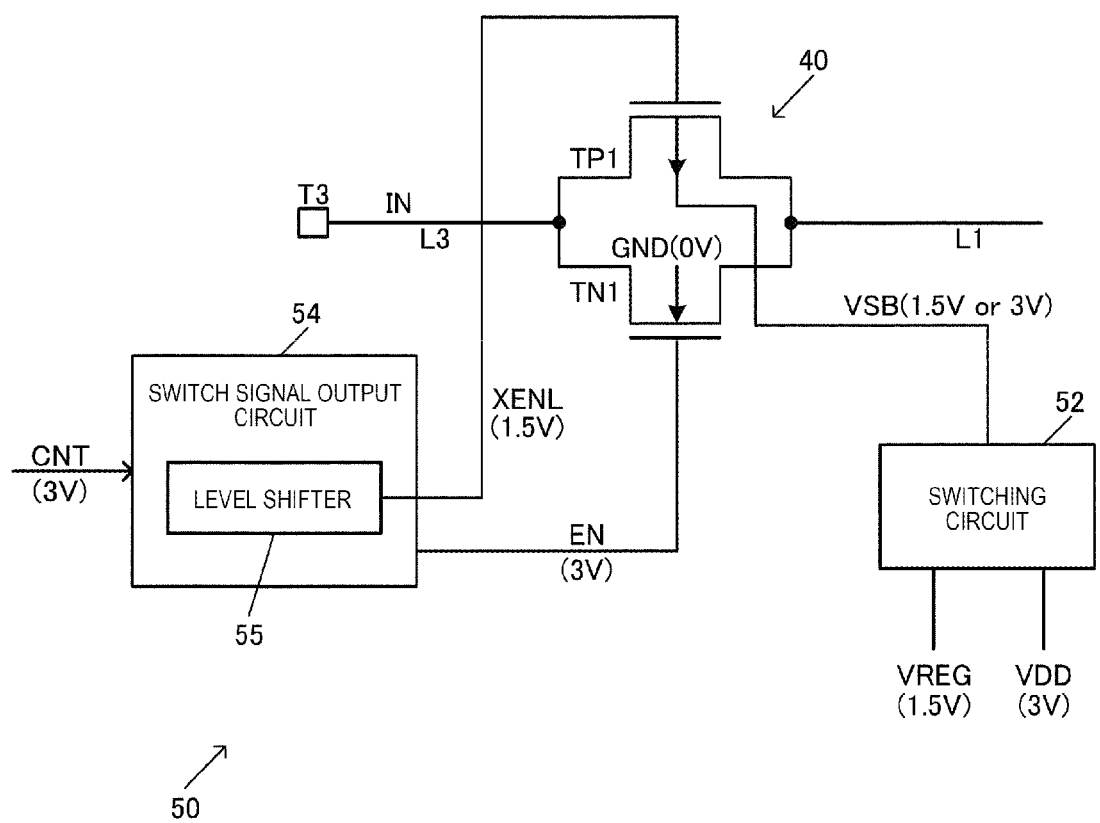
FIG. 13 shows a configuration example of a control circuit.

FIG. 13 shows a configuration example of the control circuit 50. For example, in FIG. 13, the control circuit 50 includes a switching circuit 52. The switching circuit 52 outputs the regulated voltage VREG as the substrate voltage VSB of the transistor TP1 in the first mode, and outputs the power supply voltage VDD as the substrate voltage VSB of the transistor TP1 in the second mode. That is, in the normal operation mode that is the first mode, the switching circuit 52 selects the regulated voltage VREG that is a constant voltage, for example, and outputs the substrate voltage VSB of 1.5 V, for example. Thereby, the substrate of the transistor TP1 is set to a constant voltage of VSB=1.5 V and fluctuations in the load capacitance can be suppressed, and a highly accurate clock frequency can be achieved. On the other hand, in the test mode that is the second mode, for example, the power supply voltage VDD is selected, and the substrate voltage VSB of 3 V, for example, is output. Thereby, the substrate of the transistor TP1 is set to VSB=3 V, and the occurrence of a leakage current or the like when the external input signal IN is input is prevented.

In FIG. 13, the control circuit 50 includes a switch signal output circuit 54. The switch signal output circuit 54 receives the control signal CNT and outputs switch signals EN and XENL for turning the switch circuit 40 on or off based on the control signal CNT. For example, the switch signal output circuit 54 outputs the switch signal EN with respect to the gate of the N-type transistor TN1 of the switch circuit 40, and outputs the switch signal XENL with respect to the gate of the P-type transistor TP1 of the switch circuit 40. "X" in XENL means negative logic, and "L" means a level-shifted voltage. The switch signals EN and XENL can also be referred to as enable signals of the switch circuit 40.

The switch signal output circuit 54 includes a level shifter 55. The level shifter 55 shifts the voltage of the control signal CNT from the power supply voltage VDD to the regulated voltage VREG. The level shifter 55 outputs the level-shifted switch signal XENL to the gate of the P-type transistor TP1. That is, the level shifter 55 shifts the H level voltage, which is the high potential side voltage of the control signal CNT, from the power supply voltage VDD to the regulated voltage VREG. Thereby, the switch signal XENL having the H level voltage of 1.5 V is output to the gate of the transistor TP1. The switch signal output circuit 54 outputs the switch signal EN having the H level voltage of 3 V to the gate of the transistor TN1. By providing such a switch signal output circuit 54, it becomes possible to generate and output the switch signals EN and XENL for appropriately turning on and off the transistors TP1 and TN1 of the switch circuit 40. For example, even when the substrate voltage VSB of the P-type transistor TP1 is set to the regulated voltage VREG, the appropriate ON/OFF control of the transistor TP1 can be realized.

Figure 14:
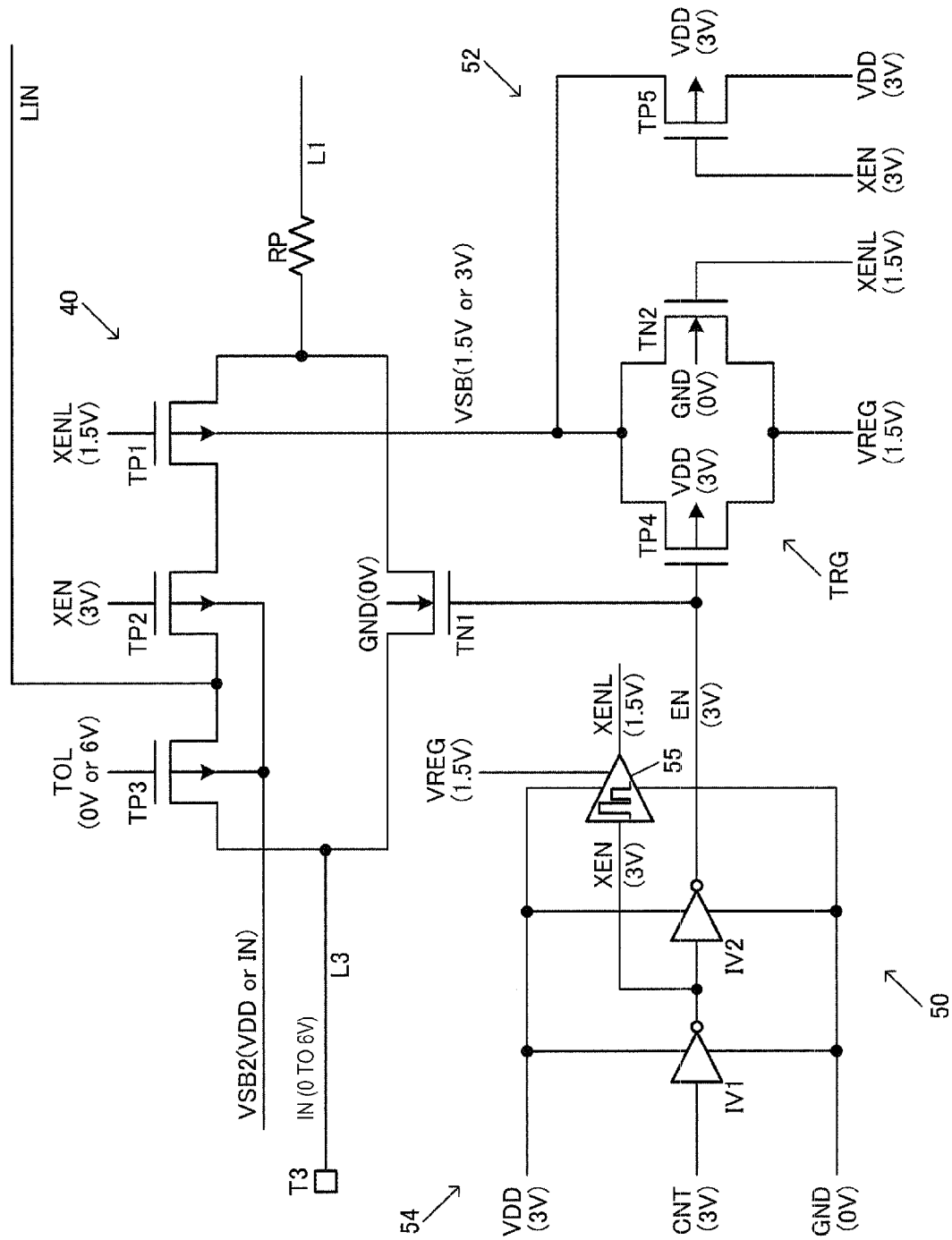
FIG. 14 shows a detailed configuration example of the switch circuit, a switching circuit, and a switch signal output circuit.

FIG. 14 shows a detailed configuration example of the switch circuit 40, a switching circuit 52, and a switch signal output circuit 54. In FIG. 14, the switch circuit 40 includes a protection transistor TP3. The protection transistor TP3 is provided between the terminal T3 to which the external input signal IN is input and the P-type transistor TP1. For example, one end of the protection transistor TP3 is coupled to the wiring L3 coupled to the terminal T3, and the other end is coupled to the transistor TP1 via, for example, the transistor TP2. The transistor TP3 is a transistor for protecting the withstanding voltage of the internal circuit of the circuit device 20, and prevents a voltage exceeding the withstanding voltage from being applied to the internal circuit. The switch circuit 40 can include the transistor TP2 provided between the transistor TP3 and the transistor TP1. The transistors TP2 and TP3 are P-type transistors. That is, the P-type transistors TP1, TP2, and TP3 and an N-type transistor TN1 are provided in parallel between the wiring L1 and the wiring L3. Further, a resistor RP is also provided on the wiring L1 side of the switch circuit 40. A signal input wiring LIN is coupled to a coupling node which is between the transistors TP3 and TP2.

The substrates of the transistors TP2 and TP3 are set to the substrate voltage VSB2. That is, the control circuit 50 outputs the substrate voltage VSB2 of the transistors TP2 and TP3. The substrate voltage VSB2 is a second substrate voltage. For example, the control circuit 50 has a tolerant circuit 56 shown in FIG. 17 to be described later, and the tolerant circuit 56 generates and outputs the substrate voltage VSB2 set on the substrates of the transistors TP2 and TP3. In FIG. 14, the transistor TP2 is provided in the switch circuit 40, but the configuration of the transistor TP2 may be omitted. In this case, the control circuit 50 outputs the substrate voltage VSB2 only to the transistor TP3.

The switching circuit 52 includes a transfer gate TRG constituted by a P-type transistor TP4 and an N-type transistor TN2, and a P-type transistor TP5. The transfer gate TRG is turned on when the switch signals EN and XENL are inactive. For example, in the normal operation mode, when the positive logic switch signal EN becomes 0 V that is an inactive voltage level and the negative logic switch signal XENL becomes 1.5 V that is an inactive voltage level, the transfer gate TRG is turned on. Thereby, the switching circuit 52 outputs the regulated voltage VREG=1.5 V as the substrate voltage VSB. At this time, since the switch signal XEN input to the gate of the P-type transistor TP5 becomes 3 V, the transistor TP5 is turned off.

On the other hand, the P-type transistor TP5 is turned on when the switch signal XEN is active. For example, in the test mode, when the negative logic switch signal XEN becomes 0 V that is an active voltage level, the transistor TP5 is turned on. Thereby, the switching circuit 52 outputs the power supply voltage VDD=3 V as the substrate voltage VSB. At this time, since the switch signal EN becomes 3 V and the switch signal XENL becomes 0 V, the transistors TP4 and TN2 are turned off and the transfer gate TRG is turned off.

The switch signal output circuit 54 includes an inverter IV1 to which the control signal CNT is input, an inverter IV2 to which the output signal of the inverter IV1 is input, and a level shifter 55 to which the output signal of the inverter IV1 is input. The output signal of the inverter IV2 becomes the switch signal EN, the output signal of the inverter IV1 becomes the switch signal XEN, and the output signal of the level shifter 55 becomes the switch signal XENL. Further, the switch signal EN output from the inverter IV1 is input to the gates of the transistors TN1 and TP4. The switch signal XEN output from the inverter IV1 is input to the gates of the transistors TP2 and TP5. The switch signal XENL output from the level shifter 55 is input to the gates of the transistors TP1 and TN2.

FIG. 15 is an explanatory diagram of an operation of the detailed configuration example in FIG. 14. In the normal operation mode, the control signal CNT becomes 0 V. The external input signal IN having a voltage level equal to or lower than VDD is input via the terminal T3. For example, in the normal operation mode, a frequency control signal, an output enable signal, or a standby signal is input as the external input signal IN via the terminal T3. Whether the frequency control signal, the output enable signal, or the standby signal is input as the external input signal IN differs depending on the type of the oscillator 4. For example, in the oscillator 4 of a model to which a frequency control signal is input, the oscillation frequency is controlled based on the frequency control signal. In the oscillator 4 of a model to which an output enable signal is input, the enable and disable of the output of the clock signal CK is controlled based on the output enable signal. In the oscillator 4 of a model to which a standby signal is input, setting of a standby state of the oscillator 4 is controlled using the standby signal. These controls are executed by the control circuit 50 or the processing circuit 28. In the oscillator 4 of the model that does not use the external input signal IN in the normal operation mode, the terminal T3 and an external terminal TE3 become NC pins and are not used.

Further, in the normal operation mode, when the control signal CNT becomes 0 V, the switch signal EN becomes 0 V, and the negative logic switch signal XEN becomes VDD=3 V. The level-shifted negative logic switch signal XENL becomes VREG=1.5 V due to the level shift by the level shifter 55. Accordingly, the transistors TP1, TP2, and TN1 of the switch circuit 40 in FIG. 14 are turned off, the wiring L3 and the wiring L1 are electrically de-coupled with each other, and the electrical coupling between the terminal T3 and the terminal T1 is turned off.

In the normal operation mode, a signal TOL input to the gate of the protection transistor TP3 becomes 0 V, and the transistor TP3 is turned on. Thereby, the frequency control signal, the output enable signal, or the standby signal input as the external input signal IN via the terminal T3 can be input to the control circuit 50 or the processing circuit 28 via the signal input wiring LIN as described with reference to FIG. 2. Accordingly, a frequency control, an output enable control, or a standby control is performed.

Further, in the normal operation mode, the transistors TP4 and TN2 of the transfer gate TRG are turned on, the transistor TP5 is turned off, and the substrate voltage VSB of the transistor TP1 is set to VREG=1.5 V. At this time, the substrate voltage VSB2 of the transistors TP2 and TP3 is set to VDD=3 V by the tolerant circuit 56 in FIG. 17 to be described later.

In the present embodiment, the substrate voltage VSB of the transistor TP1 is set to the regulated voltage VREG=1.5 V in the normal operation mode. Accordingly, even when the power supply voltage VDD fluctuates, the fluctuation of the substrate voltage VSB of the transistor TP1 can be extremely small, so that it is possible to prevent the frequency accuracy from being deteriorated due to the fluctuation of the junction capacitance Cj. When the substrate voltage VSB of the transistor TP1 is set to the regulated voltage VREG=1.5 V, by inputting the switch signal XENL having a voltage level of 1.5 V level-shifted by the level shifter 55 to the gate of the transistor TP1, the transistor TP1 can be set to an appropriate OFF state.

In the test mode such as the overdrive mode, the control signal CNT becomes VDD=3 V. The external input signal IN having a voltage level equal to or lower than VDD is input. For example, a test mode signal such as an overdrive signal is input as the external input signal IN having a voltage level equal to or lower than VDD.

In the test mode, when the control signal CNT becomes VDD=3 V, the switch signal EN becomes VDD=3 V, and the switch signals XEN and XENL become 0 V. Thereby, the transistors TP1, TP2, and TN1 of the switch circuit 40 are turned on. The transistor TP3 is also turned on when the signal TOL input to the gate becomes 0 V, and the wiring L3 and the wiring L1 are electrically coupled with each other via the switch circuit 40. Further, the transistor TP5 is turned on, the transistors TP4 and TN2 of the transfer gate TRG are turned off, and the substrate voltage VSB of the transistor TP1 is set to VDD=3 V. At this time, the substrate voltage VSB2 of the transistors TP2 and TP3 is set to VDD=3 V by the tolerant circuit 56 in FIG. 17.

In a memory writing mode in which information is written to the non-volatile memory 26 described with reference to FIG. 2, the control signal CNT becomes 0 V. Further, as the external input signal IN, a signal of the memory writing voltage VP having a voltage level equal to or higher than VDD is input. For example, VP=6 V is input. Further, the switch signal EN becomes 0 V, and the switch signals XEN and XENL become VDD and VREG, respectively. Accordingly, the transistors TP1, TP2, and TN1 of the switch circuit 40 are turned off, and the wiring L3 and the wiring L1 are electrically de-coupled, so that the memory writing voltage VP is prevented from being transmitted to the wiring L1. The signal TOL input to the gate of the protection transistor TP3 becomes 6 V. Accordingly, the transistor TP3 is turned off and the wiring L3 and the wiring LIN are electrically de-coupled, so that the memory writing voltage VP is prevented from being transmitted to the wiring LIN. Further, the transistors TP4 and TN2 of the transfer gate TRG are turned on, and the substrate voltage VSB of the transistor TP1 is set to VREG=1.5 V.

Figure 17:
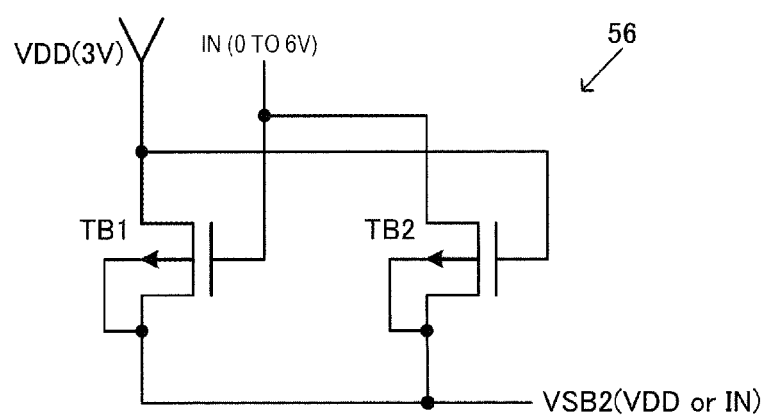
FIG. 17 shows a configuration example of a tolerant circuit.

The substrate voltage VSB2 of the transistors TP3 and TP2 is set to the same voltage level as the external input signal IN by the tolerant circuit 56 in FIG. 17. Specifically, the substrate voltage VSB2 becomes at the same voltage level as the memory writing voltage VP=6 V. Further, the signal TOL input to the gate of the transistor TP3 also becomes 6 V, and the transistor TP3 is turned off. That is, in the protection transistor TP3, both the gate potential and the substrate potential are set to VP=6 V. In this way, in the memory writing mode of the non-volatile memory 26, the protection transistor TP3 is appropriately turned off, and VP that is a high voltage is transmitted to the internal circuit of the circuit device 20, thereby, a situation where the withstanding voltage of the internal circuit is exceeded can be prevented.

Figure 16:
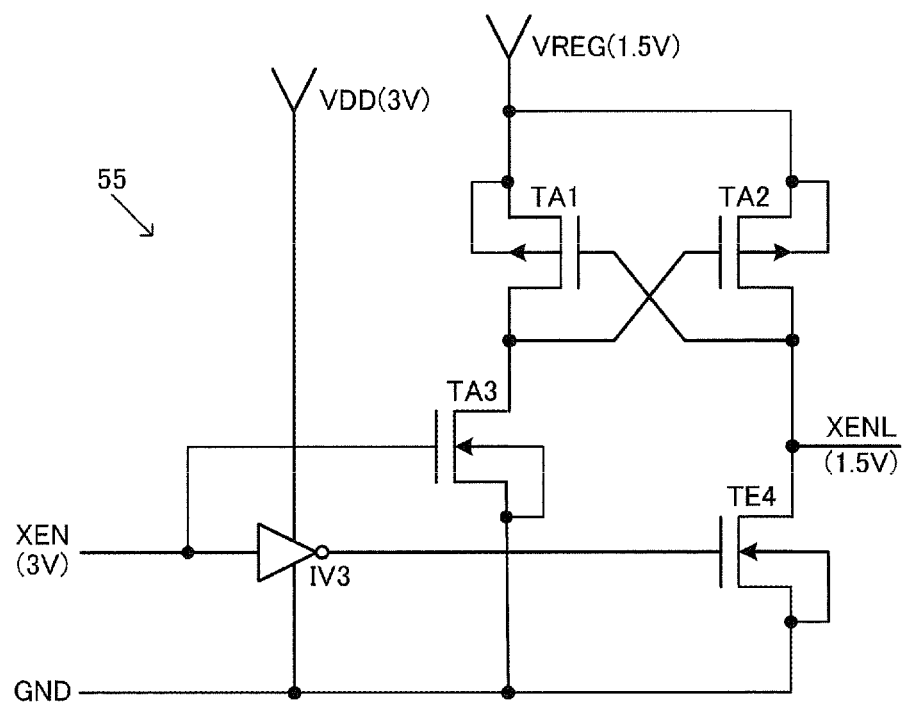
FIG. 16 shows a configuration example of a level shifter.

FIG. 16 shows a configuration example of the level shifter 55. The level shifter 55 includes P-type transistors TA1 and TA2, N-type transistors TA3 and TA4, and an inverter IV3. The level shifter 55 performs a level-shift of a switch signal XEN having an amplitude of 0 to 3 V, for example, and outputs a switch signal XENL having an amplitude of 0 to 1.5 V. That is, the level shifter 55 outputs a signal obtained by level-shifting the voltage level on the high potential side of the switch signal EN as the switch signal XENL.

FIG. 17 shows a configuration example of the tolerant circuit 56. The tolerant circuit 56 includes P-type transistors TB1 and TB2. In the transistor TB1, VDD is input to a source and the external input signal IN is input to a gate. In the transistor TB2, the external input signal IN is input to a source, and VDD is input to a gate. When the voltage level of the external input signal IN is equal to or lower than VDD=3 V, the tolerant circuit 56 having such a configuration outputs a voltage level of VDD as the substrate voltage VSB2. On the other hand, when the voltage level of the external input signal IN becomes higher than VDD, a signal having the same voltage level as that of the external input signal IN is output as the substrate voltage VSB2. In the memory writing mode, by setting such a substrate voltage VSB2 as the substrate voltage of the protection transistor TP3 in FIG. 14, the transistor TP3 is appropriately turned off, and the high voltage VP is transmitted to the internal circuit of the circuit device 20, thereby, a situation where the withstanding voltage of the internal circuit is exceeded can be prevented.

4. Oscillation Circuit

Figure 18:
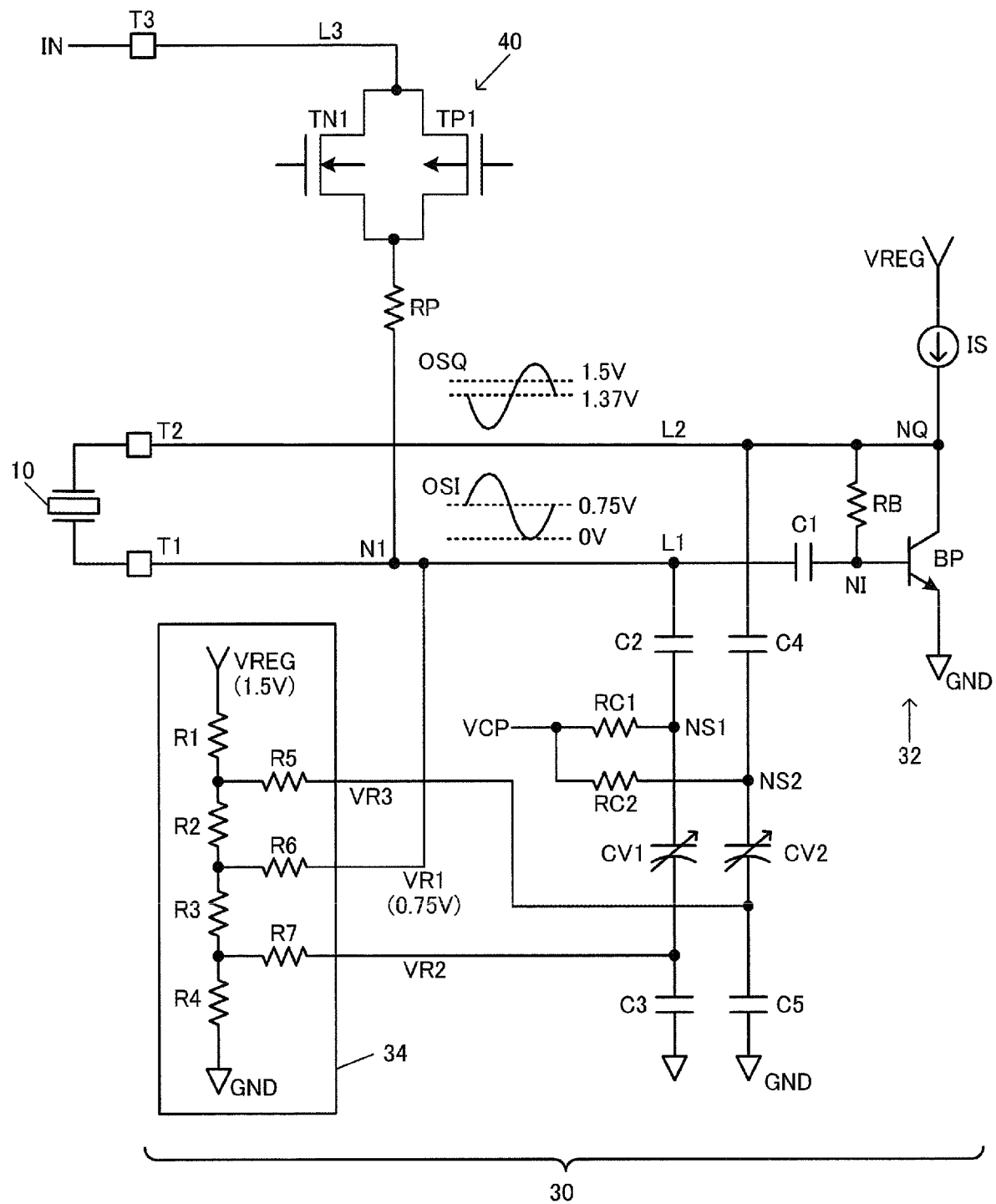
FIG. 18 shows a first configuration example of an oscillation circuit.

Next, details of the oscillation circuit 30 will be described. FIG. 18 shows a first configuration example of the oscillation circuit 30. The oscillation circuit 30 includes a drive circuit 32, a DC cut capacitor C1, a reference voltage supply circuit 34, a DC cut capacitor C2, and a variable capacitance circuit CV1. The capacitor C1 is a first capacitor, and the capacitor C2 is a second capacitor. The oscillation circuit 30 can include a DC cut capacitor C4 and a variable capacitance circuit CV2. Note that the capacitor C4 and the variable capacitance circuit CV2 are not indispensable components. A modification can be possible without providing the capacitor C4 and the variable capacitance circuit CV2. Further, capacitors C3 and C5 are provided between the variable capacitance circuits CV1 and CV2, and the node of GND. The capacitors C2 and C4 have sufficiently larger capacities than variable capacitance circuits CV1 and CV2.

The drive circuit 32 is a circuit that drives the vibrator 10 to oscillate. In FIG. 18, the drive circuit 32 includes a current source IS, a bipolar transistor BP, and a resistor RB. The current source IS is provided between the power supply node of VREG and the bipolar transistor BP, and supplies a constant current to the bipolar transistor BP. The bipolar transistor BP is a transistor that drives the vibrator 10. A base node is an input node NI of the drive circuit 32, and a collector node is an output node NQ of the drive circuit 32. The resistor RB is provided between the collector node and the base node of the bipolar transistor BP.

Figure 23:
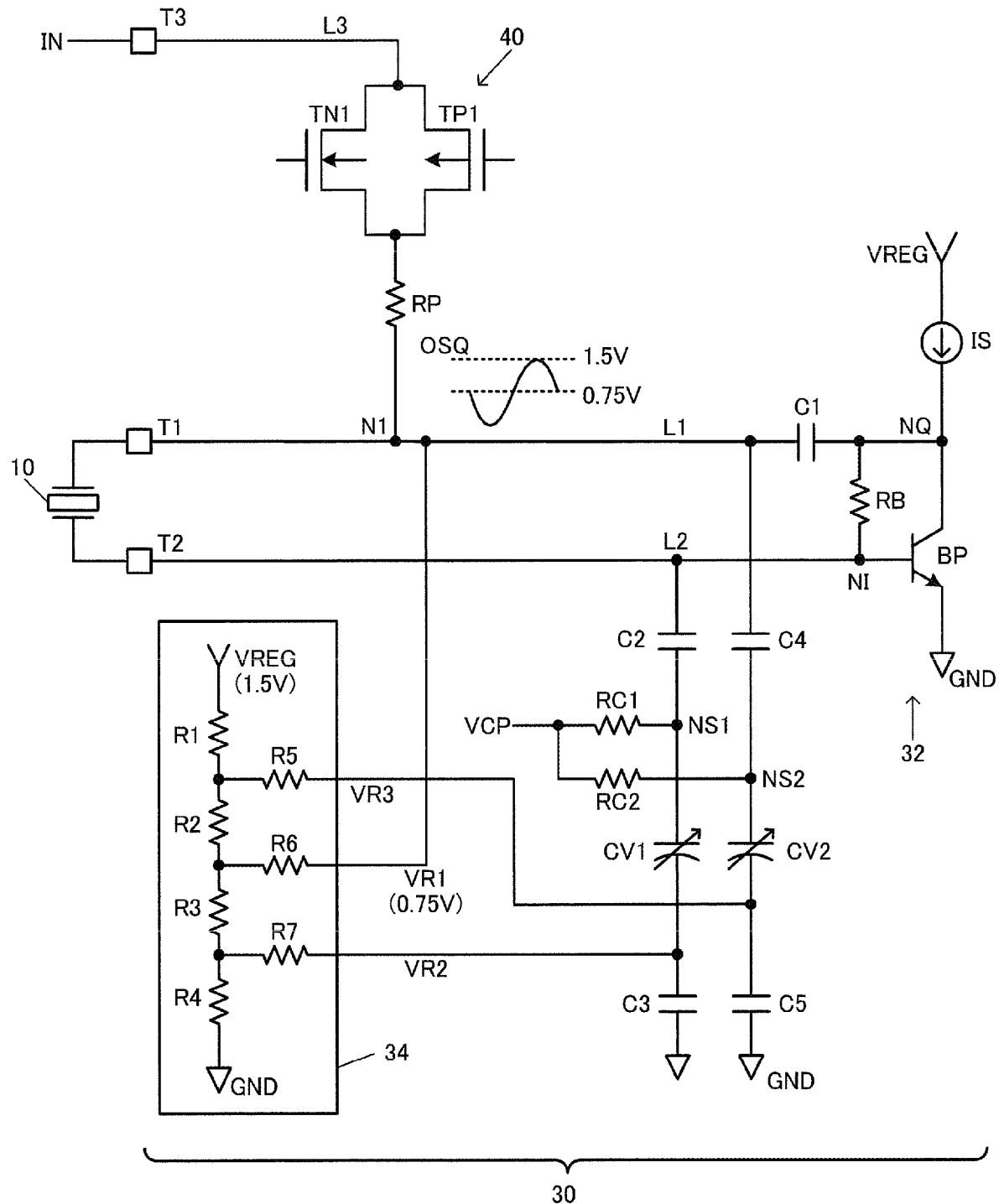
FIG. 23 shows a third configuration example of the oscillation circuit.

The DC cut capacitor C1 is provided between an input node NI of the drive circuit 32 and the wiring L1. For example, the capacitor C1 has one end coupled to the input node NI of the drive circuit 32 and the other end coupled to the wiring L1. The wiring L1 is a first wiring coupled to the terminal T1. By providing such a capacitor C1, the DC component of the oscillation signal OSI is cut, and only the AC component is transmitted to the input node NI of the drive circuit 32, so that the bipolar transistor BP can be properly operated. Note that, as shown in FIG. 23 to be described later, the DC cut capacitor C1 may be provided between an output node NQ of the drive circuit 32 and the wiring L1.

The reference voltage supply circuit 34 supplies a reference voltage VR1 to the wiring L1. That is, the reference voltage VR1 is supplied to the wiring L1 that couples the terminal T1 and the oscillation circuit 30 with each other. The reference voltage supply circuit 34 supplies the reference voltage of VR1=0.75 V to the wiring L1, so that an amplitude center voltage of the oscillation signal OSI in the wiring L1 can be set to 0.75 V. The amplitude center voltage 1.37 V of the oscillation signal OSQ in the wiring L2 is set based on, for example, a base-emitter voltage VBE of the bipolar transistor BP and a base current IB flowing through the resistor RB. For example, the amplitude center voltage of the oscillation signal OSQ is set to a voltage of VBE+ IB×RB.

The reference voltage supply circuit 34 supplies the reference voltage VR2 to the other end of the variable capacitance circuit CV1, and supplies the reference voltage VR3 to the other end of the variable capacitance circuit CV2. Thereby, a voltage applied to both ends of the variable capacitance circuit CV1 and a voltage applied to both ends of the variable capacitance circuit CV2 can be set to appropriate voltages. The reference voltage supply circuit 34 includes resistors R1, R2, R3, and R4 provided in series between the VREG node and the GND node, and outputs voltages obtained by dividing the VREG voltage as reference voltages VR3, VR1, and VR2. Resistors R5, R6, and R7 are provided between each coupling node of the resistors R1, R2, R3, and R4 and the output nodes of the reference voltages VR3, VR1, and VR2.

Capacitor C2 has one end electrically coupled to the wiring L1 and the other end electrically coupled to the supply node NS1 of the capacitance control voltage VCP. The capacitance control voltage VCP is supplied to the supply node NS1 via the resistor RC1. One end of the variable capacitance circuit CV1 is electrically coupled to the supply node NS1. The reference voltage supply circuit 34 supplies the reference voltage VR2 to the other end of the variable capacitance circuit CV1. The reference voltage VR2 is a second reference voltage. The variable capacitance circuit CV1 is constituted by a variable capacitance element such as a varactor, and the capacity is controlled based on the capacitance control voltage VCP. By controlling the capacity of the variable capacitance circuit CV1, the load capacitance of the oscillation circuit 30 can be controlled, and the oscillation frequency of the oscillation circuit 30 can be controlled. By controlling the oscillation frequency in this way, it is possible to adjust the oscillation frequency to be a nominal frequency and possible to perform temperature compensation processing of the clock frequency.

Capacitor C4 has one end electrically coupled to the wiring L2 and the other end electrically coupled to the supply node NS2 of the capacitance control voltage VCP. That is, one end of the capacitor C4 is coupled to the wiring L2 which couples the terminal T2 and the oscillation circuit 30 with each other. The capacitance control voltage VCP is supplied to the supply node NS2 via the resistor RC2. One end of the variable capacitance circuit CV2 is electrically coupled to the supply node NS2. The reference voltage supply circuit 34 supplies the reference voltage VR3 to the other end of the variable capacitance circuit CV2. The reference voltage VR3 is a third reference voltage. The variable capacitance circuit CV2 is constituted by a variable capacitance element such as a varactor, and the capacity is controlled based on the capacitance control voltage VCP. By controlling the capacity of the variable capacitance circuit CV2, the load capacitance of the oscillation circuit 30 can be controlled, and the oscillation frequency of the oscillation circuit 30 can be controlled.

In FIG. 18, the switch circuit 40 is provided between the terminal T3 and the wiring L1. In the test mode, the switch circuit 40 is turned on, and a test external input signal IN input via the terminal T3 is input to one end of the vibrator 10 via the switch circuit 40, the wiring L1, and the terminal T1. Thereby, it is possible to perform tests and inspections such as overdrive or DLD. In FIG. 18, the substrate of the P-type transistor TP1 is set to the regulated voltage VREG in the normal operation mode, but a modification may be made in which the substrate of the transistor TP1 is set to the power supply voltage VDD.

Figure 19:
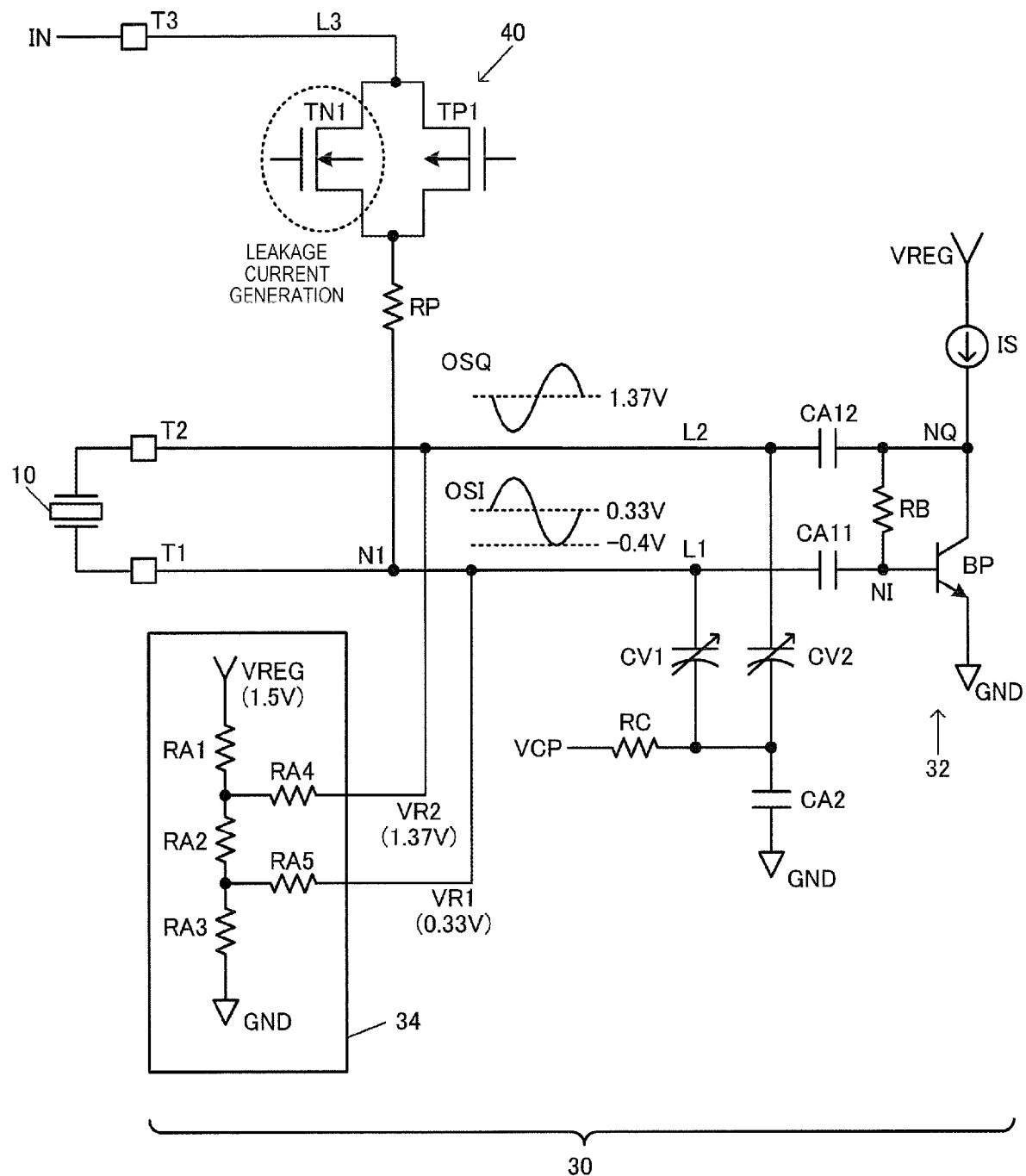
FIG. 19 shows a second configuration example of the oscillation circuit.

FIG. 19 shows a second configuration example of the oscillation circuit 30. The second configuration example in FIG. 19 is a configuration that is a comparative example of the first configuration example in FIG. 19. In FIG. 19, DC cut capacitors CA11 and CA12 are provided between the input node NI of the drive circuit 32 of the oscillation circuit 30 and the wiring L1, and between the output node NQ and the wiring L2, respectively. One ends of the variable capacitance circuits CV1 and CV2 are coupled to the wirings L1 and L2 without going through a DC cut capacitor. That is, the DC cut capacitors C2 and C4 shown in FIG. 18 are not provided in FIG. 19. Further, the reference voltage supply circuit 34 supplies the reference voltage VR1=0.33 V to the wiring L1, and also supplies the reference voltage VR2=1.37 V to the wiring L2. In this way, the amplitude center voltage of the oscillation signal OSI in the wiring L1 is set to VR1=0.33 V, and the amplitude center voltage of the oscillation signal OSQ in the wiring L2 is set to VR2=1.37 V. The DC components of the oscillation signals OSI and OSQ are cut by the DC cut capacitors CA11 and CA12 so that only the AC component is transmitted.

In the second configuration example in FIG. 19, a leakage current is generated in the N-type transistor TN1 of the switch circuit 40 provided for the test mode, and there is a problem that the oscillation frequency becomes unstable due to the leakage current.

For example, in a model in which the terminal T3 and the external terminal TE3 become frequency control terminals in the normal operation mode, a frequency control signal is input as the external input signal IN. Similarly, in a model in which the terminal T3 becomes an output enable terminal and a standby terminal in the normal operation mode, an output enable signal and a standby signal are input as the external input signal IN, respectively.

On the other hand, in the oscillation circuit 30 in FIG. 19, the oscillation amplitude of the oscillation signal OSI in the wiring L1 swings greatly to a negative voltage side. Therefore, the N-type transistor TN1 of the switch circuit 40 becomes a weakly turned-on state, and a leakage current flows to the terminal T3 side.

As described above, the external input signal IN such as a frequency control signal, an output enable signal, or a standby signal is input to the terminal T3 in the normal operation mode, and the voltage level of the external input signal IN changes variously. Therefore, when the voltage level of the external input signal IN changes, the magnitude of the leakage current flowing through the N-type transistor TN1 also changes, causing a problem that the oscillation frequency of the oscillation circuit 30 becomes unstable.

For example, in FIG. 19, the reference voltage supply circuit 34 supplies the reference voltages VR1 and VR2 that satisfy VR1=0.33 V and VR2=1.37 V to the wirings L1 and L2, respectively. Thereby, the amplitude center voltages of the oscillation signals OSI and OSQ of the wirings L1 and L2 are set to 0.33 V and 1.37 V, respectively. Therefore, the voltages applied to the variable capacitance circuits CV1 and CV2 are different from each other, and the linearity characteristic for the change in capacity with respect to the capacitance control voltage VCP is improved. That is, the linearity of the change in capacity can be secured over a wide voltage range. This capacity is a total capacity of the variable capacitance circuits CV1 and CV2.

Figure 20:
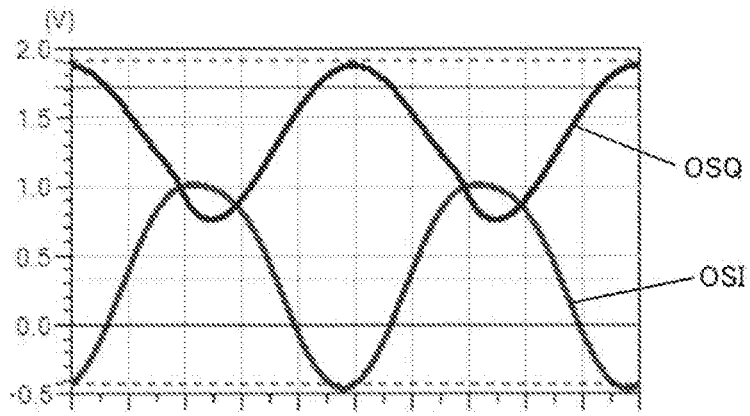
FIG. 20 shows a signal waveform example of the oscillation signal in the second configuration example.

However, in FIG. 19, the amplitude center voltage of the oscillation signal OSI is 0.33 V, and since the voltage is relatively low, when the amplitude of the oscillation signal OSI is large, the voltage level on a low potential side becomes a negative voltage as shown in FIG. 20. For example, in FIG. 20, the voltage level on the low potential side of the oscillation signal OSI is a negative voltage of substantially −0.4 V. When the voltage level of the oscillation signal OSI becomes the negative voltage, the N-type transistor TN1 of the switch circuit 40 becomes a weakly turned-on state, and a leakage current is generated. Further, since the value of the leakage current changes according to the voltage level of the external input signal IN, the oscillation frequency also changes and becomes unstable.

In this regard, in the first configuration example in FIG. 18, a DC cut capacitor C1 is provided between the wiring L1 coupled to the terminal T1 of the vibrator 10 and the input node NI of the drive circuit 32 of the oscillation circuit 30. By providing such a DC cut capacitor C1, the reference voltage VR1 having any voltage level can be supplied to the wiring L1. Note that the DC voltage level of the input node NI is set to the base-emitter voltage VBE of the bipolar transistor BP.

Figure 21:
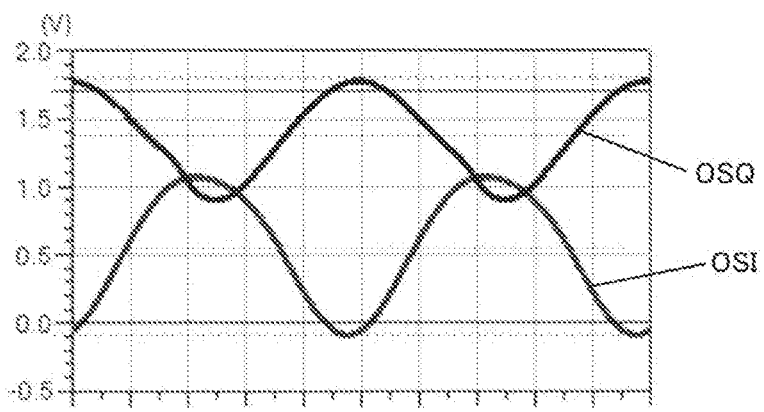
FIG. 21 shows a signal waveform example of the oscillation signal in the first configuration example.

The reference voltage supply circuit 34 supplies the reference voltage VR1 that prevents the voltage level of the oscillation signal OSI from greatly swinging to the negative voltage side to the wiring L1. For example, a reference voltage VR1 having a voltage level that does not cause a leakage current due to a forward bias of the PN junction of the transistor TN1 is supplied to the wiring L1. In FIG. 18, the reference voltage supply circuit 34 supplies the reference voltage VR1=0.75 V to the wiring L1. Thereby, as shown in FIG. 21, the voltage level of the oscillation signal OSI does not greatly swing to the negative voltage side, and in the N-type transistor TN1 of the switch circuit 40, a leakage current caused by a negative voltage is prevented from occurring. A DC cut capacitor C2 is provided between the wiring L1 and the supply node NS1 of the capacitance control voltage VCP so that the reference voltage VR1 supplied to the wiring L1 does not affect the capacity of the variable capacitance circuit CV1. In this way, even when the voltage level of the reference voltage VR1 supplied to the wiring L1 is set to 0.75 V, which is a higher voltage level than 0.33 V in FIG. 19, it is possible to prevent the capacity of the variable capacitance circuit CV1 from being affected. For the amplitude center voltage of the oscillation signal OSQ in the wiring L2 is set based on, for example, a base-emitter voltage VBE of the bipolar transistor BP and a base current IB flowing through the resistor RB. For example, the amplitude center voltage of the oscillation signal OSQ is set to a voltage level of VBE+IB×RB, and is set to 1.37 V, for example, in FIG. 18.

As described above, in the first configuration example in FIG. 18, since the setting of the reference voltage VR1 by the reference voltage supply circuit 34 prevents the voltage level of the oscillation signal OSI from greatly swinging to the negative voltage side, the leakage current occurring in the N-type transistor TN1 of the switch circuit 40 is suppressed. Therefore, it is possible to effectively prevent a situation in which the leakage current changes due to a change in voltage level of the external input signal IN and the oscillation frequency becomes unstable.

Figure 22:
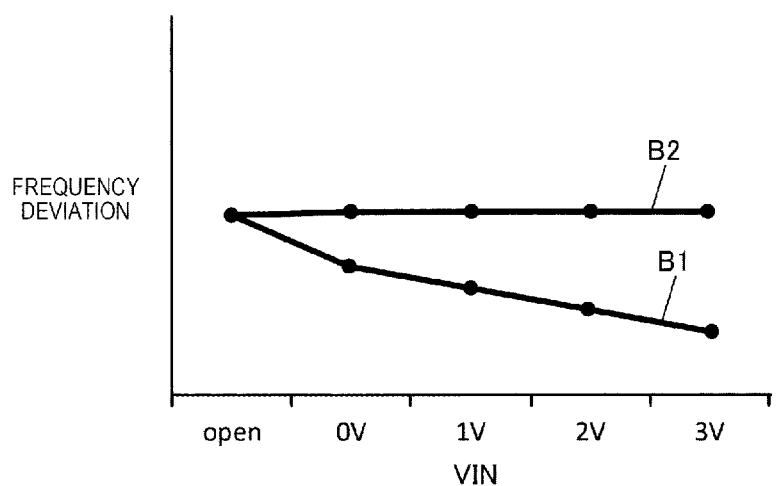
FIG. 22 is an explanatory diagram of a frequency fluctuation due to a change in voltage of an external input signal.

For example, FIG. 22 is a diagram for explaining the fluctuation of the frequency with respect to the fluctuation of the voltage VIN of the external input signal IN. In the case of the second configuration example in FIG. 19, as shown by B1, when the voltage VIN of the external input signal IN changes, the oscillation frequency also fluctuates. On the other hand, in the case of the first configuration example shown in FIG. 18, as shown by B2, even when the voltage VIN of the external input signal IN changes, the oscillation frequency hardly fluctuates.

In FIG. 18, the reference voltage supply circuit 34 supplies the reference voltage VR2 that is the second reference voltage to the other end of the variable capacitance circuit CV1. In this way, the voltage applied to both ends of the variable capacitance circuit CV1 is set to VCP−VR2, and a desired voltage can be applied to the variable capacitance circuit CV1. The reference voltage supply circuit 34 supplies a reference voltage VR3 that is higher than the reference voltage VR2, for example, to the other end of the variable capacitance circuit CV2. Thereby, the voltage applied to both ends of the variable capacitance circuit CV1 becomes VCP−VR2, while the voltage applied to both ends of the variable capacitance circuit CV2 becomes VCP1−VR3, so that both voltages can be made different. For example, VCP−VR2>VCP−VR3 can be set. Thereby, the linearity characteristic of a change in total capacity of the variable capacitance circuits CV1 and CV2 with respect to the capacitance control voltage VCP can be improved, and the linearity of a change in capacity can be secured over a wide voltage range. As a result, the frequency fluctuation of the clock signal can be reduced, and the frequency accuracy can be improved.

FIG. 23 shows a third configuration example of the oscillation circuit 30. In FIG. 18, the DC cut capacitor C1 is provided between the input node NI of the drive circuit 32 of the oscillation circuit 30 and the wiring L1, but in FIG. 23, the DC cut capacitor C1 is provided between the output node NQ of the drive circuit 32 and the wiring L1. In other words, in FIG. 18, the terminal T1 is a terminal on the input node NI side of the drive circuit 32, but in FIG. 23, the terminal T1 is a terminal on the output node NQ side of the drive circuit 32. Further, one end of the switch circuit 40 is coupled to the wiring L1, and the reference voltage supply circuit 34 supplies the reference voltage VR1=0.75 V to the wiring L1. In FIG. 23, the substrate of the P-type transistor TP1 of the switch circuit 40 is set to the regulated voltage VREG=1.5 V in the normal operation mode. As described above, when the substrate of the transistor TP1 is set to the regulated voltage VREG=1.5 V, if the amplitude voltage of the oscillation signal OSQ greatly exceeds 1.5 V, a leakage current may occur in the transistor TP1. In this regard, in FIG. 23, when the reference voltage supply circuit 34 supplies the reference voltage VR1=0.75 V to the wiring L1, the amplitude center voltage of the oscillation signal OSQ is set to 0.75 V, and the operation is performed so that the amplitude voltage of the oscillation signal OSQ does not greatly exceed 1.5V. Thereby, the leakage current is prevented from occurring in the transistor TP1, and a situation in which the oscillation frequency fluctuates due to the leakage current can be prevented.

Figure 24:
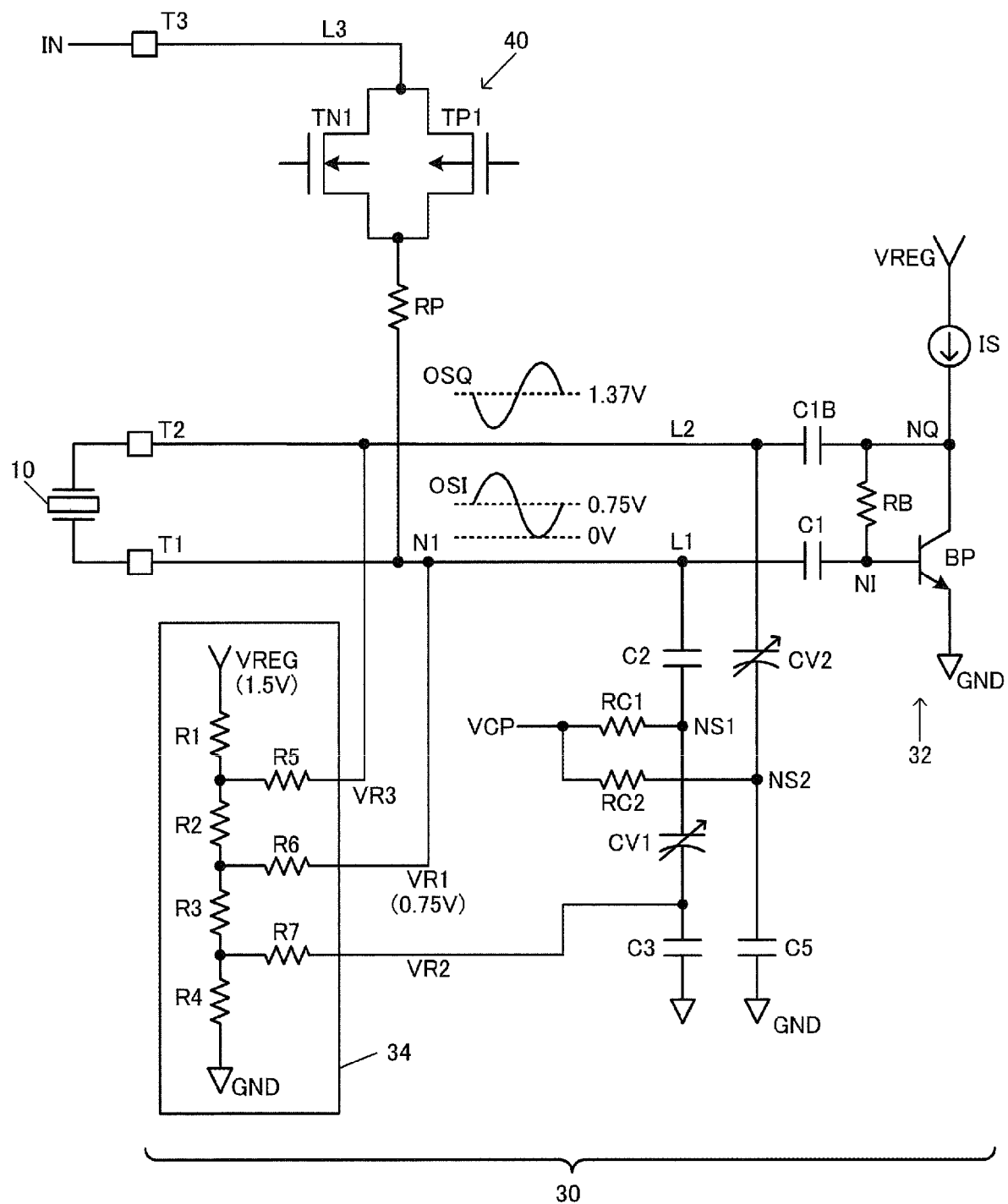
FIG. 24 shows a fourth configuration example of the oscillation circuit.

FIG. 24 shows a fourth configuration example of the oscillation circuit 30. The oscillation circuit 30 in FIG. 24 includes the capacitor C1 provided between the input node NI of the drive circuit 32 and the wiring L1, the capacitor C2 having one end coupled to the wiring L1 and the other end coupled to the VCP supply node NS1, and the variable capacitance circuit CV1 having one end coupled to the supply node NS1, and in this regard, the configuration is the same as in FIG. 18.

On the other hand, in FIG. 24, the capacitor C1B is provided between the output node NQ of the drive circuit 32 and the wiring L2, one end of the variable capacitance circuit CV2 is coupled to the wiring L2, and the reference voltage supply circuit 34 supplies the reference voltage VR3 to the wiring L2, and in this regard, the configuration is different from that in FIG. 18. That is, in FIG. 24, the coupling configurations of the capacitor C1B and the variable capacitance circuit CV2 are the same as the coupling configurations of the capacitor CA12 and the variable capacitance circuit CV2 in the second configuration example in FIG. 19. In the oscillation circuit 30 in FIG. 24, the DC cut capacitor C1 is provided between the input node NI and the wiring L1, and the reference voltage supply circuit 34 supplies VR1=0.75 V to the wiring L1. Thereby, it is possible to prevent a situation in which the voltage level of the oscillation signal OSI greatly swings in the negative direction and a leakage current occurs. Further, in FIG. 24, the voltage applied to the both ends of the variable capacitance circuit CV1 becomes VCP−VR2, and the voltage applied to the both ends of the variable capacitance circuit CV2 becomes VCP−VR3, thereby, the both voltages are different. Therefore, the linearity characteristic of a change in total capacity of the variable capacitance circuits CV1 and CV2 with respect to the capacitance control voltage VCP can be improved, and the linearity of a change in capacity can be secured over a wide voltage range.

5. Oscillator

Figure 25:
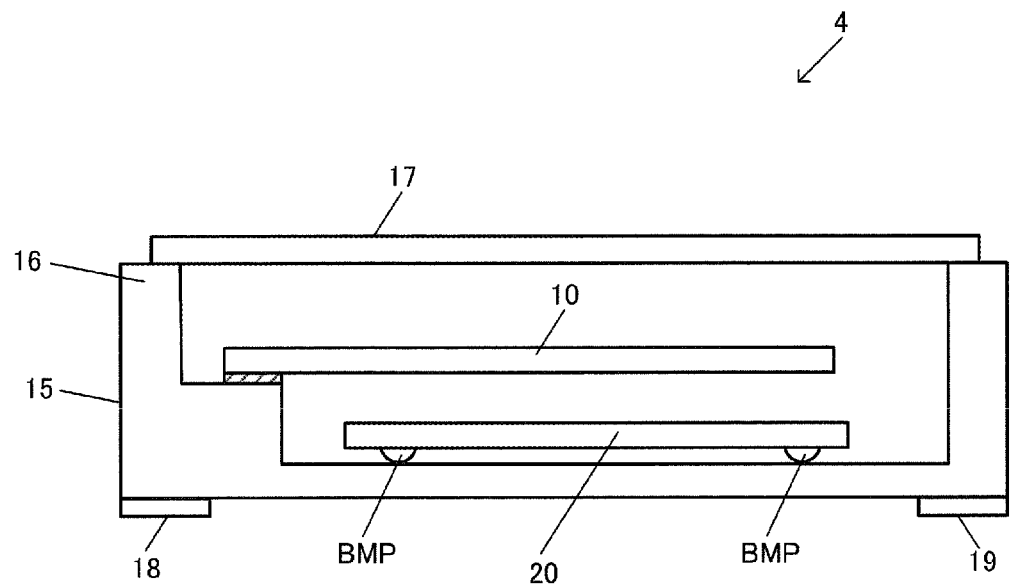
FIG. 25 shows a first structural example of an oscillator.

Next, a structural example of the oscillator 4 of the present embodiment will be described. FIG. 25 shows a first structural example of the oscillator 4. The oscillator 4 has the vibrator 10, the circuit device 20, and the package 15 that accommodates the vibrator 10 and the circuit device 20. The package 15 is made of, for example, ceramic or the like, and has an accommodation space inside thereof, and the vibrator and the circuit device 20 are accommodated in the accommodation space. The accommodation space is hermetically sealed and is preferably in a reduced pressure state that is close to a vacuum state. With the package 15, the vibrator 10 and the circuit device 20 can be suitably protected from impact, dust, heat, moisture, and the like.

The package 15 has a base 16 and a lid 17. Specifically, the package 15 includes a base 16 that supports the vibrator 10 and the circuit device 20, and a lid 17 that is bonded to the upper surface of the base 16 so as to form an accommodation space with the base 16. And the vibrator 10 is supported by the step portion provided inside the base 16 via the terminal electrode. The circuit device 20 is disposed on the inner bottom surface of the base 16. Specifically, the circuit device 20 is disposed such that the active surface faces the inner bottom surface of the base 16. The active surface is a surface on which circuit elements of the circuit device 20 are formed. Further, bumps BMP are formed on terminals that are pads of the circuit device 20. The circuit device 20 is supported on the inner bottom surface of the base 16 via the conductive bumps BMP. The conductive bump BMP is, for example, a metal bump, and the vibrator 10 and the circuit device 20 are electrically coupled to each other via the bump BMP, the internal wiring of the package 15, the terminal electrode, or the like. The circuit device 20 is electrically coupled to the external terminals 18 and 19 of the oscillator 4 via the bumps BMP or the internal wiring of the package 15. The external terminals 18 and 19 are formed on the outer bottom surface of the package 15. The external terminals 18 and 19 are coupled to an external device via the external wirings. The external wiring is, for example, a wiring or the like formed on a circuit substrate on which an external device is mounted. Thereby, a clock signal or the like can be output to the external device.

In FIG. 25, the circuit device 20 is flip-mounted so that the active surface of the circuit device 20 faces downward, but the present embodiment is not limited to such mounting. For example, the circuit device 20 may be mounted so that the active surface of the circuit device 20 faces upward. That is, the circuit device 20 is mounted so that the active surface faces the vibrator 10.

Figure 26:
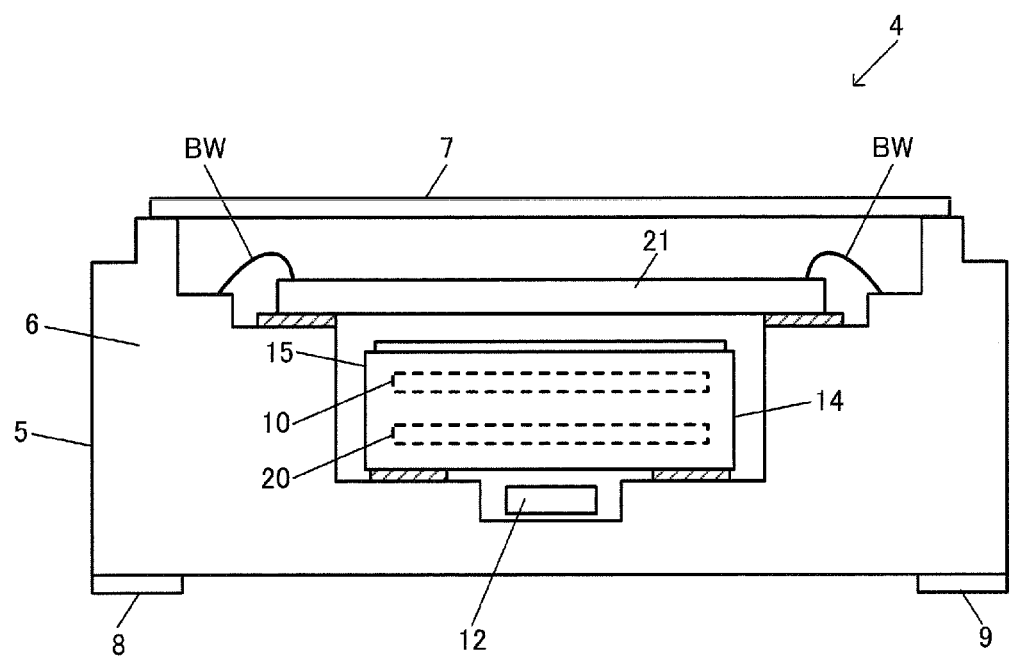
FIG. 26 shows a second structural example of the oscillator.

FIG. 26 shows a second structural example of the oscillator 4. The oscillator 4 in FIG. 26 includes a vibrator 10, a circuit device 20, and a circuit device 21. The oscillator 4 also includes the package 15 accommodating the vibrator 10 and the circuit device 20, and a package 5 accommodating the package 15 and the circuit device 21. The package 15 and the package 5 are a first package and a second package, respectively. The first package and the second package can also be referred to as a first container and a second container.

In the present embodiment, the circuit device 20 accommodated in the package 15 performs the first temperature compensation processing, and the circuit device 21 accommodated in the package 5 performs the second temperature compensation processing. For example, the vibrator 10 and the circuit device 20 are accommodated in the package 15, so that a temperature compensation type oscillator 14 that performs, for example, an analog-mode first temperature compensation processing is configured. Further, the oscillator 14 that performs analog-mode first temperature compensation processing and the circuit device 21 that performs digital-mode second temperature compensation processing are accommodated in the package 5, so that the oscillator 4 that generates highly accurate clock signal is configured. The circuit device 21 can also be called a correction IC that performs the second temperature compensation processing with a fine adjustment in a digital-mode.

Specifically, the package 5 is made of, for example, ceramic or the like, and has an accommodation space inside thereof. In this accommodation space, the oscillator 14, in which the vibrator 10 and the circuit device 20 are accommodated in the package 15, and the circuit device 21 are accommodated. The accommodation space is hermetically sealed and is preferably in a reduced pressure state that is close to a vacuum state. With the package 5, the circuit device 21 and the oscillator 14 can be suitably protected from impact, dust, heat, moisture, and the like.

The package 5 has a base 6 and a lid 7. Specifically, the package 5 includes a base 6 that supports the oscillator 14 and the circuit device 21, and a lid 7 that is bonded to the upper surface of the base 6 so as to form an accommodation space with the base 6. The base 6 inside thereof has a first recess portion opening on the upper surface and a second recess portion opening on the bottom surface of the first recess portion. The circuit device 21 is supported on the bottom surface of the first recess portion. For example, the circuit device 21 is supported by a step portion on the bottom surface via a terminal electrode. The oscillator 14 is supported on the bottom surface of the second recess portion. For example, the oscillator 14 is supported by the step portion on the bottom surface via the terminal electrode. Further, the base 6 has a third recess portion opening in the bottom surface of the second recess portion, and the circuit component 12 is disposed in the third recess portion. For example, a capacitor or a temperature sensor can be assumed as the circuit component 12 to be disposed.

The circuit device 21 is electrically coupled to a terminal of the oscillator 14 via, for example, a bonding wire BW, a terminal electrode formed in a step portion, or an internal wiring of the package 5. Thereby, the clock signal or the temperature detection signal from the oscillator 14 can be input to the circuit device 21. Further, the circuit device 21 is electrically coupled to an external terminals 8 and 9 of the oscillator 4 via the bonding wire BW, the terminal electrode formed in the step portion, and the internal wiring of the package 5. The external terminals 8 and 9 are formed on the outer bottom surface of the package 5. The external terminals 8 and 9 are coupled to an external device via the external wirings. The external wiring is, for example, a wiring or the like formed on a circuit substrate on which an external device is mounted. Thereby, a clock signal or the like can be output to the external device. Note that the terminal of the oscillator 14 and the external terminals 8 and 9 may be electrically coupled with each other.

In FIG. 26, the circuit device 21 is disposed in the upward direction of the oscillator 14, but the circuit device 21 may be disposed in the downward direction of the oscillator 14. The upward direction is a direction from the bottom surface of the package 5 toward the lid 7, and the downward direction is the opposite direction. The circuit device 21 may be provided on the side of the oscillator 14. That is, the oscillator 14 and the circuit device 21 are arranged side by side so as to be aligned in an upper surface view of the oscillator 4.

Next, the circuit device 21 will be described. The circuit device 21 includes a clock signal generation circuit to which a first clock signal that is a clock signal generated by the oscillator 14 is input as a reference clock signal. The clock signal generated by the clock signal generation circuit is output to the outside as an output clock signal of the oscillator 4. For example, the clock signal generation circuit of the circuit device 21 is constituted by a fractional N-type PLL circuit to which the first clock signal from the oscillator 14 is input as a reference clock signal. The PLL circuit performs a phase comparison of a reference clock signal that is a first clock signal and a feedback clock signal obtained by dividing the output clock signal of the PLL circuit by a frequency dividing circuit. A fractional N-type PLL circuit is realized by setting a fractional division ratio using a delta sigma modulation circuit. Further, the processing circuit included in the circuit device 21 performs correction processing of the division ratio data set in the PLL circuit based on the temperature compensation data, thereby the second temperature compensation processing is realized. The first temperature compensation processing performed in the oscillator 14 is realized by, for example, polynomial approximation temperature compensation processing performed by the processing circuit 28 in FIG. 2. The clock signal generation circuit may be constituted by a direct digital synthesizer. In this case, the second temperature compensation processing is realized by inputting the frequency control data corrected by the temperature compensation data with respect to the direct digital synthesizer that operates using the first clock signal as a reference clock signal.

According to the oscillator 4 in FIG. 26, the circuit device 20 that oscillates the vibrator 10 performs the first temperature compensation processing, thereby the amount of the frequency fluctuation in the frequency-temperature characteristics of the first clock signal which is output from the circuit device 20 that is a first circuit device, can be reduced. Further, the circuit device 21 that is the second circuit device performs the second temperature compensation processing when the clock signal is generated based on the first clock signal from the circuit device 20. As described above, the second temperature compensation processing is performed by the circuit device 21 after the first temperature compensation processing is performed by the circuit device 20, thereby it becomes possible to reduce or the like the micro-jump of frequency caused by variation of the temperature measurement result or the like, and possible to realize the clock frequency of the oscillator 4 with high accuracy or the like. In the oscillator 4 in FIG. 26, the first temperature compensation processing may be performed using a temperature sensor provided in the circuit device 20, and a temperature detection signal of this temperature sensor may be output from the circuit device 20 and input to the circuit device 21. The circuit device 21 may perform the second temperature compensation processing based on the input temperature detection signal. As described above, the first temperature compensation processing in the circuit device 20 and the second temperature compensation processing in the circuit device 21 can be performed based on the temperature detection signal from the same temperature sensor so that more appropriate temperature compensation processing can be realized. In this case, a distance between the temperature sensor built in the circuit device 20 and the vibrator 10 is shorter than a distance between the temperature sensor and the circuit device 21. Accordingly, by performing the digital temperature compensation processing, the distance between the circuit device 21 that generates a large amount of heat and the vibrator 10 can be increased, and the adverse effect of the heat generated by the circuit device 21 on the temperature detection result of the temperature sensor can be reduced. Therefore, the temperature of the vibrator 10 can be measured more accurately using the temperature sensor built in the circuit device 20.

6. Electronic Apparatus and Vehicle

Figure 27:
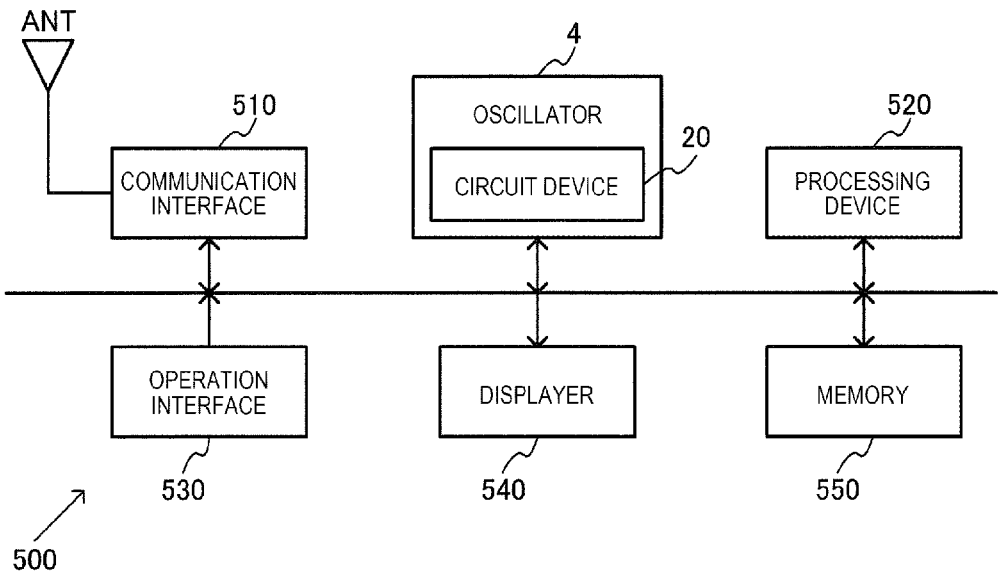
FIG. 27 shows a configuration example of an electronic apparatus.

FIG. 27 shows a configuration example of an electronic apparatus 500 including the circuit device 20 of the present embodiment. The electronic apparatus 500 includes the circuit device 20 of the present embodiment and a processing device 520 that operates by a clock signal based on the oscillation signal of the oscillation circuit 30 of the circuit device 20. Specifically, the electronic apparatus 500 includes the oscillator 4 having the circuit device 20 of the present embodiment, and the processing device 520 operates based on the clock signal from the oscillator 4. The electronic apparatus 500 can include an antenna ANT, a communication interface 510, an operation interface 530, a displayer 540, and a memory 550. The electronic apparatus 500 is not limited to the configuration shown in FIG. 27, and various modifications such as omitting some of these components or adding other components are possible.

The electronic apparatus 500 is, for example, a network-related apparatus such as a base station or a router, a high-precision measuring apparatus that measures physical quantities such as distance, time, flow velocity, or flow rate, a biological information measuring apparatus that measures biological information, or an in-vehicle apparatus. The biological information measuring apparatus is, for example, an ultrasonic measuring apparatus, a pulse wave meter, a blood pressure measuring apparatus, or the like. The in-vehicle apparatus is an apparatus for automatic driving or the like. The electronic apparatus 500 may be a wearable apparatus such as a head mounted type display device or a clock related apparatus, a mobile information terminal such as a robot, a printing device, a projection device, a smartphone, a content providing apparatus that delivers content, a video apparatus such as a digital camera or a video camera, or the like.

Further, as the electronic apparatus 500, there is an apparatus used in a next generation mobile communication system such as 5G. For example, the circuit device 20 of the present embodiment can be used in various apparatuses such as a base station, a remote radio head (RRH), or a mobile communication terminal of a next generation mobile communication system. In the next generation mobile communication system, a highly accurate clock frequency is required for time synchronization and the like, which is suitable as an application example of the circuit device 20 of the present embodiment that can generate a highly accurate clock signal.

The communication interface 510 performs processing of receiving data from the outside via the antenna ANT and transmitting data to the outside. The processing device 520 that is a processor performs control processing of the electronic apparatus 500, various digital processing of data transmitted/received via the communication interface 510, or the like. The function of the processing device 520 can be realized, for example, by a processor such as a microcomputer. The operation interface 530 is for a user to perform an input operation, and can be realized by an operation button, a touch panel display, or the like. The displayer 540 displays various types of information and can be realized by a display such as a liquid crystal or an organic EL. The memory 550 stores data, and the function can be realized by a semiconductor memory such as a RAM or a ROM.

Figure 28:
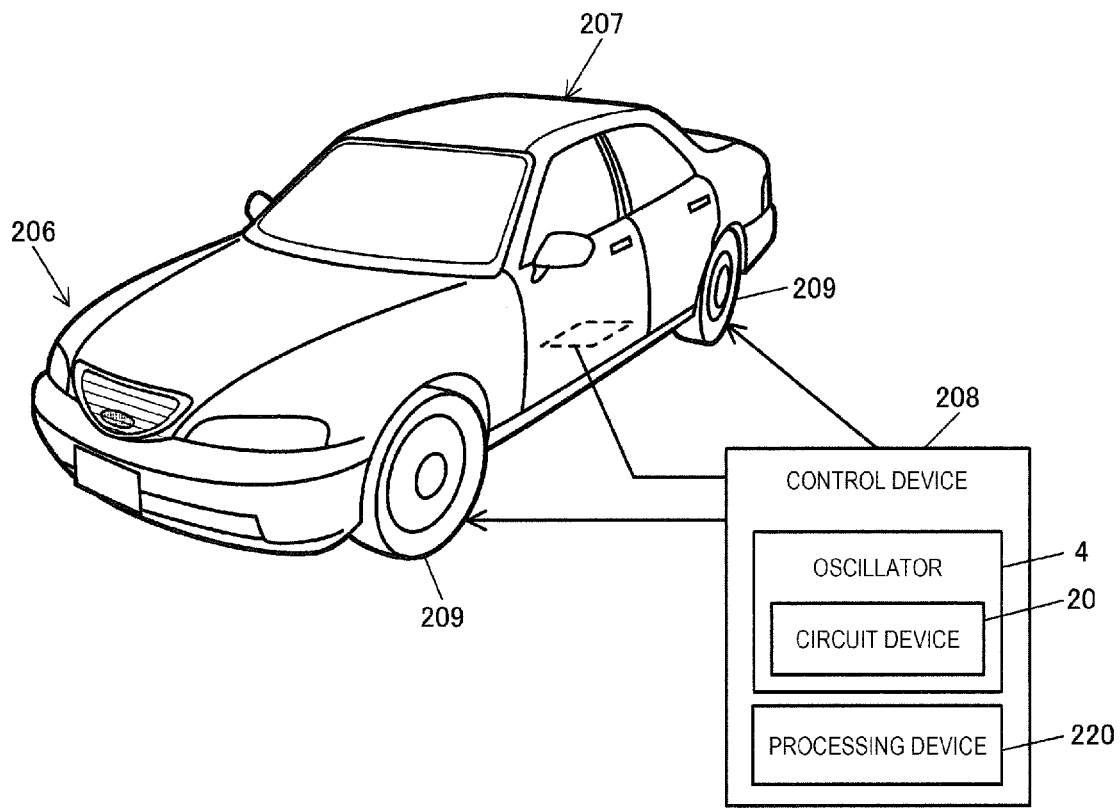
FIG. 28 shows a configuration example of a vehicle.

FIG. 28 shows an example of a vehicle including the circuit device 20 of the present embodiment. The vehicle includes the circuit device 20 of the present embodiment and a processing device 220 that operates by a clock signal based on an oscillation signal of the oscillation circuit 30 of the circuit device 20. Specifically, the vehicle includes the oscillator 4 having the circuit device 20 of the present embodiment, and the processing device 220 operates based on the clock signal from the oscillator 4. The circuit device 20 of the present embodiment can be incorporated into various moving objects such as vehicles, airplanes, motorcycles, bicycles, or ships. The vehicle is an apparatus/device that moves on the ground, in the sky, or on the sea, and includes a driving mechanism such as an engine or a motor, a steering mechanism such as a steering wheel or a rudder, and various electronic apparatuses. FIG. 28 schematically shows an automobile 206 as a specific example of the vehicle. The automobile 206 incorporates the circuit device 20 of the present embodiment. Specifically, the automobile 206 that is a vehicle includes a control device 208, and the control device 208 includes the oscillator 4 including the circuit device 20 of the present embodiment and a processing device 220 operating based on a clock signal generated by the oscillator 4. The control device 208, for example, controls the hardness of the suspension according to the posture of a vehicle body 207, and controls brakes of the individual wheels 209. For example, automatic driving of the automobile 206 may be realized by the control device 208. The apparatus in which the circuit device 20 of the present embodiment is incorporated is not limited to such a control device 208, and can be incorporated in various in-vehicle apparatuses such as a meter panel apparatus and a navigation apparatus provided in a moving object such as the automobile 206.

As described above, the circuit device according to the present embodiment includes a first terminal electrically coupled to one end of a vibrator, a second terminal electrically coupled to the other end of the vibrator, an oscillation circuit electrically coupled to the first terminal and the second terminal, and oscillating the vibrator, and a third terminal to which an external input signal is input. The circuit device also includes a switch circuit provided between a first wiring which couples the first terminal and the oscillation circuit with each other and the third terminal, and having a P-type transistor, and a control circuit outputting a regulated voltage, in which a power supply voltage is regulated, as a substrate voltage of the P-type transistor.

According to the present embodiment, the oscillation circuit oscillates the vibrator that is electrically coupled to the first terminal and the second terminal so that generates the oscillation signal. The switch circuit is provided between the first wiring coupling the first terminal and the oscillation circuit, and the third terminal to which the external input signal is input. By providing such a switch circuit, the external input signal that is input via the third terminal can be input to the vibrator via the switch circuit that is turned on, the first wiring, and the first terminal. On the other hand, in a case where the substrate voltage of the P-type transformer of the switch circuit is set to, for example, the power supply voltage when the switch circuit is in the OFF state, the power supply voltage fluctuation adversely affects the oscillation operation of the vibrator, thereby, there is a risk of a problem such as a fluctuation in the oscillation frequency. In this regard, according to the present embodiment, the regulated voltage having a stable potential is set as the substrate voltage of the P-type transformer of the switch circuit. Therefore, even when the power supply voltage fluctuates, it is possible to suppress the fluctuation of the substrate voltage of the P-type transformer, and thus it is possible to prevent the power supply voltage fluctuation from adversely affecting the oscillation operation of the vibrator.

In the present embodiment, the control circuit may include a switching circuit that outputs the regulated voltage as the substrate voltage in a first mode, and outputs the power supply voltage as the substrate voltage in a second mode.

As described above, in the first mode, the substrate voltage of the P-type transistor of the switch circuit is set to the regulated voltage, thereby it is possible to prevent the power supply voltage fluctuation from adversely affecting the oscillation operation of the vibrator. On the other hand, in the second mode, the substrate voltage of the P-type transistor of the switch circuit is set to the power supply voltage, so that, for example, even when the external input signal at the power supply voltage level is applied to the source of the P-type transistor or the like, it is possible to prevent the leakage current from flowing to the substrate.

In the present embodiment, the first mode may be a normal operation mode, and the second mode may be a test mode.

As described above, a proper oscillation operation of the vibrator can be realized in the normal operation mode that is the first mode, and a test mode signal can be input via the third terminal as the external input signal and input to one end of the vibrator in the normal operation mode that is the second mode.

In the present embodiment, the control circuit may include a switch signal output circuit that receives a control signal and outputs a switch signal for turning the switch circuit on or off based on the control signal, and the switch signal output circuit may include a level shifter that level-shifts a voltage of the control signal from the power supply voltage to the regulated voltage and outputs the level-shifted switch signal to a gate of the P-type transistor.

As described above, even when the regulated voltage is applied as the substrate voltage of the P-type transistor of the switch circuit, the appropriate ON/OFF control of the P-type transistor can be realized.

In the present embodiment, the circuit device may further include a fourth terminal to which the power supply voltage is input, a fifth terminal to which a ground voltage is input, a regulator outputting the regulated voltage based on the power supply voltage from the fourth terminal, and a second switch circuit provided between a second wiring which couples the second terminal and the oscillation circuit with each other and the fifth terminal, and being turned on when the switch circuit is turned on.

As described above, the regulated voltage can be generated by the regulator that operates based on the power supply voltage from the fourth terminal, and can be set as the substrate voltage of the P-type transistor. Further, when the external input signal from the third terminal is input to one end of the vibrator via the switch circuit that is turned on, the other end of the vibrator can be coupled to the ground via the second switch circuit that is turned on.

In the present embodiment, the switch circuit may be a transfer gate constituted by the P-type transistor and an N-type transistor.

By adopting such a transfer gate configuration, the voltage drop in the switch circuit for the external input signal can be reduced, and the external input signal having an appropriate voltage level can be input to one end of the vibrator.

In the present embodiment, the switch circuit may include a protection transistor that is provided between the third terminal and the P-type transistor.

By providing such a protection transistor, it is possible to prevent an inappropriate voltage level signal from being transmitted to the internal circuit of the circuit device.

In the present embodiment, the control circuit may output a second substrate voltage as a substrate voltage of the protection transistor.

As described above, an appropriate second substrate voltage in accordance with the voltage level of the signal input to the protection transistor can be applied to the substrate of the protection transistor.

In the present embodiment, the circuit device may further include a non-volatile memory to which a memory writing voltage is supplied via the third terminal, and the protection transistor may be turned off in a memory writing mode of the non-volatile memory.

As described above, the memory writing voltage can be supplied to the non-volatile memory using the third terminal, and the non-volatile memory writing operation can be realized. In the memory writing mode of the non-volatile memory, the protection transistor is turned off, so that the memory writing voltage can be prevented from being transmitted to the internal circuit of the circuit device.

In the present embodiment, the oscillation circuit may include a drive circuit that drives and oscillates the vibrator, a first capacitor for DC cut provided between an input node or an output node of the drive circuit and the first wiring, a reference voltage supply circuit that supplies a reference voltage to the first wiring, a second capacitor for DC cut of which one end is electrically coupled to the first wiring and the other end is electrically coupled to a supply node of a capacitance control voltage, and a variable capacitance circuit of which one end is electrically coupled to the supply node.

According to the oscillation circuit having such a configuration, the DC component of the oscillation signal in the first wiring can be cut using the first capacitor and transmitted to the drive circuit of the oscillation circuit. Further, when the first wiring is set to the reference voltage by the reference voltage supply circuit, the DC component is cut by the second capacitor, so that the capacity of the variable capacitance circuit can be prevented from being affected by the reference voltage.

The circuit device according to the present embodiment includes a first terminal electrically coupled to one end of a vibrator, a second terminal electrically coupled to the other end of the vibrator, an oscillation circuit electrically coupled to the first terminal and the second terminal, and oscillating the vibrator, a third terminal to which an external input signal is input, and a switch circuit provided between a first wiring which couples the first terminal and the oscillation circuit with each other, and the third terminal. In addition, the oscillation circuit includes a drive circuit that drives and oscillates the vibrator, a first capacitor for DC cut provided between an input node or an output node of the drive circuit and the first wiring, a reference voltage supply circuit that supplies a reference voltage to the first wiring, a second capacitor for DC cut of which one end is electrically coupled to the first wiring and the other end is electrically coupled to a supply node of a capacitance control voltage, and a variable capacitance circuit of which one end is electrically coupled to the supply node.

According to the present embodiment, the oscillation circuit oscillates the vibrator that is electrically coupled to the first terminal and the second terminal so that generates the oscillation signal. The switch circuit is provided between the first wiring coupling the first terminal and the oscillation circuit, and the third terminal to which the external input signal is input. By providing such a switch circuit, the external input signal that is input via the third terminal can be input to the vibrator via the switch circuit that is turned on, the first wiring, and the first terminal. By adopting the oscillation circuit having such a configuration, the DC component of the oscillation signal in the first wiring can be cut using the first capacitor and transmitted to the drive circuit of the oscillation circuit. Further, when the first wiring is set to the reference voltage by the reference voltage supply circuit, the DC component is cut by the second capacitor, so that the capacity of the variable capacitance circuit can be prevented from being affected by the reference voltage.

In the present embodiment, the reference voltage supply circuit may supply a second reference voltage to the other end of the variable capacitance circuit.

As described above, a voltage corresponding to the voltage difference between the capacitance control voltage and the second reference voltage is applied to both ends of the variable capacitance circuit, and the capacity of the variable capacitance circuit can be set appropriately.

The present embodiment also relates to the circuit device described above and an oscillator including a vibrator.

Further, the present embodiment relates to an electronic apparatus including the circuit device described above and a processing device that operates according to a clock signal based on an oscillation signal of the oscillation circuit.

Further, the present embodiment relates to a vehicle including the circuit device described above and a processing device that operates according to a clock signal based on an oscillation signal of the oscillation circuit.

Although the present embodiment has been described in detail as described above, it will be easily understood by those skilled in the art that many modifications can be made without departing from the novel matters and effects of the present disclosure. Accordingly, all such modifications are intended to be included within the scope of the present disclosure. For example, a term described at least once together with a different term having a broader meaning or the same meaning in the specification or the drawings can be replaced with the different term in any part of the specification or the drawings. For example, terms such as a normal operation mode and a test mode can be replaced with terms such as a first mode and a second mode. All combinations of the present embodiment and the modification examples are also included in the scope of the present disclosure. Further, the configurations/operations of the circuit device, the oscillator, the electronic apparatus, and the vehicle are not limited to those described in this embodiment, and various modifications can be made.

What is claimed is:

1. A circuit device comprising:
   a first terminal electrically coupled to one end of a vibrator;
   a second terminal electrically coupled to the other end of the vibrator;
   an oscillation circuit electrically coupled to the first terminal and the second terminal, and oscillating the vibrator;
   a third terminal to which an external input signal is input;
   a switch circuit provided between a first wiring which couples the first terminal and the oscillation circuit with each other and the third terminal, and having a P-type transistor; and
   a control circuit outputting a regulated voltage, in which a power supply voltage is regulated, as a substrate voltage of the P-type transistor,
   wherein the control circuit includes a switching circuit that outputs the regulated voltage as the substrate voltage in a first mode, and outputs the power supply voltage as the substrate voltage in a second mode.

2. The circuit device according to claim 1, wherein the first mode is a normal operation mode, and the second mode is a test mode.

3. The circuit device according to claim 1, further comprising:
   a fourth terminal to which the power supply voltage is input;
   a fifth terminal to which a ground voltage is input;
   a regulator outputting the regulated voltage based on the power supply voltage from the fourth terminal; and
   a second switch circuit provided between a second wiring which couples the second terminal and the oscillation circuit with each other and the fifth terminal, and being turned on when the switch circuit is turned on.

4. The circuit device according to claim 1, wherein the switch circuit is a transfer gate constituted by the P-type transistor and an N-type transistor.

5. The circuit device according to claim 1, wherein the switch circuit includes a protection transistor that is provided between the third terminal and the P-type transistor.

6. The circuit device according to claim 5, wherein the control circuit outputs a second substrate voltage as a substrate voltage of the protection transistor.

7. The circuit device according to claim 5, further comprising:
   a non-volatile memory to which a memory writing voltage is supplied via the third terminal, wherein the protection transistor is turned off in a memory writing mode of the non-volatile memory.

8. An oscillator comprising:
   the circuit device according to claim 1; and
   the vibrator.

9. An electronic apparatus comprising:
   the circuit device according to claim 1; and
   a processing device operating according to a clock signal based on an oscillation signal of the oscillation circuit.

10. A vehicle comprising:
    the circuit device according to claim 1; and
    a processing device operating according to a clock signal based on an oscillation signal of the oscillation circuit.

11. A circuit device comprising:
    a first terminal electrically coupled to one end of a vibrator;
    a second terminal electrically coupled to the other end of the vibrator;
    an oscillation circuit electrically coupled to the first terminal and the second terminal, and oscillating the vibrator;
    a third terminal to which an external input signal is input;
    a switch circuit provided between a first wiring which couples the first terminal and the oscillation circuit with each other and the third terminal, and having a P-type transistor; and
    a control circuit outputting a regulated voltage, in which a power supply voltage is regulated, as a substrate voltage of the P-type transistor,
    wherein the control circuit includes a switch signal output circuit that receives a control signal and outputs a switch signal for turning the switch circuit on or off based on the control signal, and the switch signal output circuit includes a level shifter that level-shifts a voltage of the control signal from the power supply voltage to the regulated voltage and outputs the level-shifted switch signal to a gate of the P-type transistor.

12. A circuit device comprising:
a first terminal electrically coupled to one end of a vibrator;
a second terminal electrically coupled to the other end of the vibrator;
an oscillation circuit electrically coupled to the first terminal and the second terminal, and oscillating the vibrator;
a third terminal to which an external input signal is input;
a switch circuit, having a P-type transistor, provided between a first wiring which couples the first terminal and the oscillation circuit with each other, and the third terminal, wherein the oscillation circuit includes a drive circuit that drives and oscillates the vibrator, a first capacitor for DC cut provided between an input node or an output node of the drive circuit and the first wiring, a reference voltage supply circuit that supplies a reference voltage to the first wiring, a second capacitor for DC cut of which one end is electrically coupled to the first wiring and the other end is electrically coupled to a supply node of a capacitance control voltage, and a variable capacitance circuit of which one end is electrically coupled to the supply node; and
a control circuit outputting a regulated voltage, in which a power supply voltage is regulated, as a substrate voltage of the P-type transistor,
wherein the control circuit includes a switching circuit that outputs the regulated voltage as the substrate voltage in a first mode, and outputs the power supply voltage as the substrate voltage in a second mode.

13. The circuit device according to claim 12, wherein the reference voltage supply circuit supplies a second reference voltage to the other end of the variable capacitance circuit.

14. The circuit device according to claim 12, wherein the first mode is a normal operation mode, and the second mode is a test mode.

15. The circuit device according to claim 12, wherein the control circuit includes a switch signal output circuit that receives a control signal and outputs a switch signal for turning the switch circuit on or off based on the control signal, and the switch signal output circuit includes a level shifter that level-shifts a voltage of the control signal from the power supply voltage to the regulated voltage and outputs the level-shifted switch signal to a gate of the P-type transistor.

16. The circuit device according to claim 12, further comprising:
a fourth terminal to which the power supply voltage is input;
a fifth terminal to which a ground voltage is input;
a regulator outputting the regulated voltage based on the power supply voltage from the fourth terminal; and
a second switch circuit provided between a second wiring which couples the second terminal and the oscillation circuit with each other and the fifth terminal, and being turned on when the switch circuit is turned on.

17. The circuit device according to claim 12, wherein the switch circuit is a transfer gate constituted by the P-type transistor and an N-type transistor.

18. The circuit device according to claim 12, wherein the switch circuit includes a protection transistor that is provided between the third terminal and the P-type transistor.

* * * * *